United States Patent
Raj et al.

(10) Patent No.: US 10,319,458 B2
(45) Date of Patent: Jun. 11, 2019

(54) HARDWARE APPARATUSES AND METHODS TO CHECK DATA STORAGE DEVICES FOR TRANSIENT FAULTS

(71) Applicant: Intel Corporation, Santa Clara, CA (US)

(72) Inventors: Ashok Raj, Portland, OR (US); Ron Gabor, Hertzliya (IL); Hisham Shafi, Akko (IL); Mohan J. Kumar, Aloha, OR (US); Theodros Yigzaw, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 15/457,326

(22) Filed: Mar. 13, 2017

(65) Prior Publication Data

US 2017/0186498 A1   Jun. 29, 2017

Related U.S. Application Data

(63) Continuation of application No. 14/751,113, filed on Jun. 25, 2015, now Pat. No. 9,595,349.

(51) Int. Cl.
*G11C 29/00* (2006.01)
*G11C 29/38* (2006.01)
(Continued)

(52) U.S. Cl.
CPC .............. *G11C 29/38* (2013.01); *G11C 29/04* (2013.01); *G11C 29/44* (2013.01); *G11C 29/52* (2013.01);
(Continued)

(58) Field of Classification Search
CPC ..... G11C 29/38; G11C 29/44; G11C 13/0004; G11C 5/04; G11C 29/4401; G11C 29/81; G11C 2029/0409; G11C 2029/0411; G11C 29/785; G11C 29/52; G11C 11/40; G11C 17/16; G11C 17/18; G11C 29/027; G06F 11/1044; G06F 11/106
See application file for complete search history.

(56) References Cited

U.S. PATENT DOCUMENTS 6,807,590 B1 * 10/2004 Carlson ............... G06F 12/0802
710/25
8,041,989 B2 * 10/2011 Lastras-Montano ........................
G06F 11/1044
714/42
(Continued)

OTHER PUBLICATIONS

Notice of Allowance from U.S. Appl. No. 14/751,113, dated Nov. 3, 2016, 8 pages.

*Primary Examiner* — Guerrier Merant
(74) *Attorney, Agent, or Firm* — Nicholson de vos Webster & Elliott LLP

(57) ABSTRACT

Methods and apparatuses relating to a hardware memory test unit to check a section of a data storage device for a transient fault before the data is stored in and/or loaded from the section of the data storage device are described. In one embodiment, an integrated circuit includes a hardware processor to operate on data in a section of a data storage device, and a memory test unit to check the section of the data storage device for a transient fault before the data is stored in the section of the data storage device, wherein the transient fault is to cause a machine check exception if accessed by the hardware processor.

24 Claims, 17 Drawing Sheets

(51) Int. Cl.
  *G11C 29/52*   (2006.01)
  *G11C 29/04*   (2006.01)
  *G11C 29/44*   (2006.01)
  *G11C 13/00*   (2006.01)

(52) U.S. Cl.
  CPC .. *G11C 13/0004* (2013.01); *G11C 2029/0401* (2013.01)

(56) References Cited

U.S. PATENT DOCUMENTS

| | | |
|---|---|---|
| 2005/0149781 A1 | 7/2005 | Lempel et al. |
| 2005/0283716 A1 | 12/2005 | Mukherjee et al. |
| 2006/0048031 A1 | 3/2006 | Aadsen et al. |
| 2009/0006900 A1* | 1/2009 | Lastras-Montano ........................ G06F 11/1044 714/42 |
| 2009/0138772 A1 | 5/2009 | Bertacco et al. |
| 2015/0235716 A1* | 8/2015 | O'Connell ......... G11C 29/4401 714/723 |
| 2016/0027529 A1* | 1/2016 | Hoefler ................ G11C 11/408 365/154 |
| 2016/0314038 A1* | 10/2016 | Russell ................ G06F 11/106 |
| 2017/0110206 A1* | 4/2017 | Ryu ...................... G11C 29/44 |

* cited by examiner

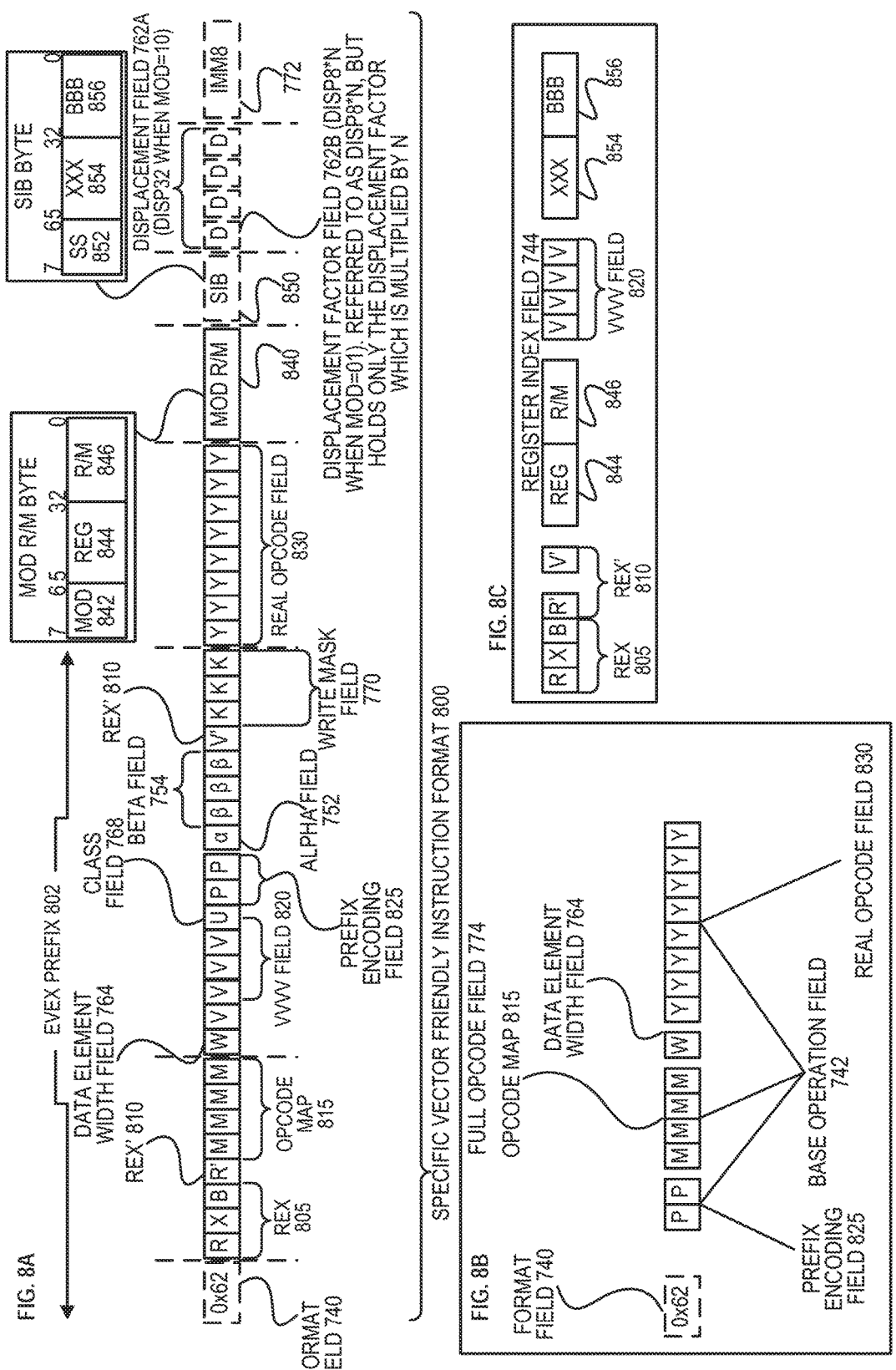

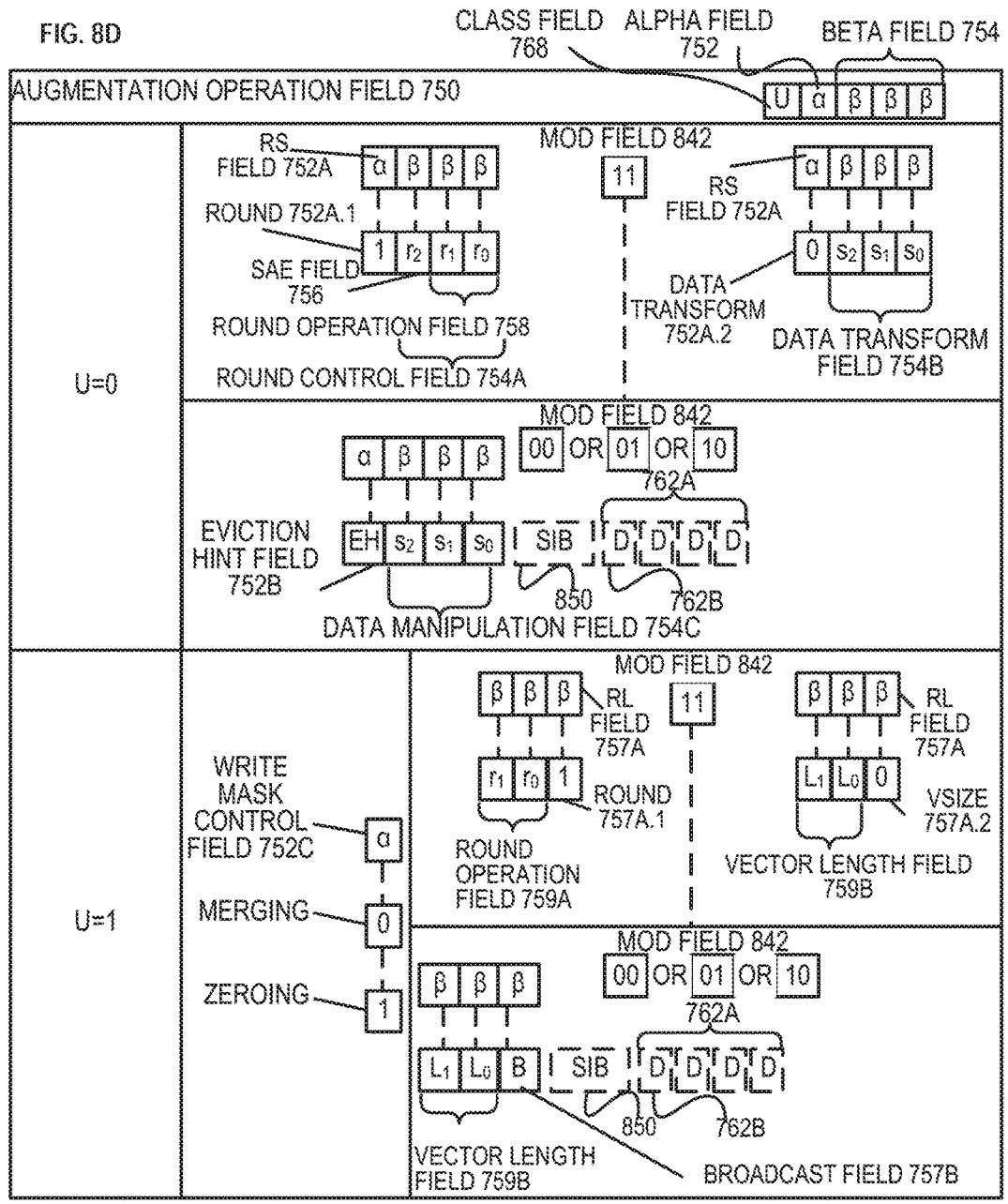

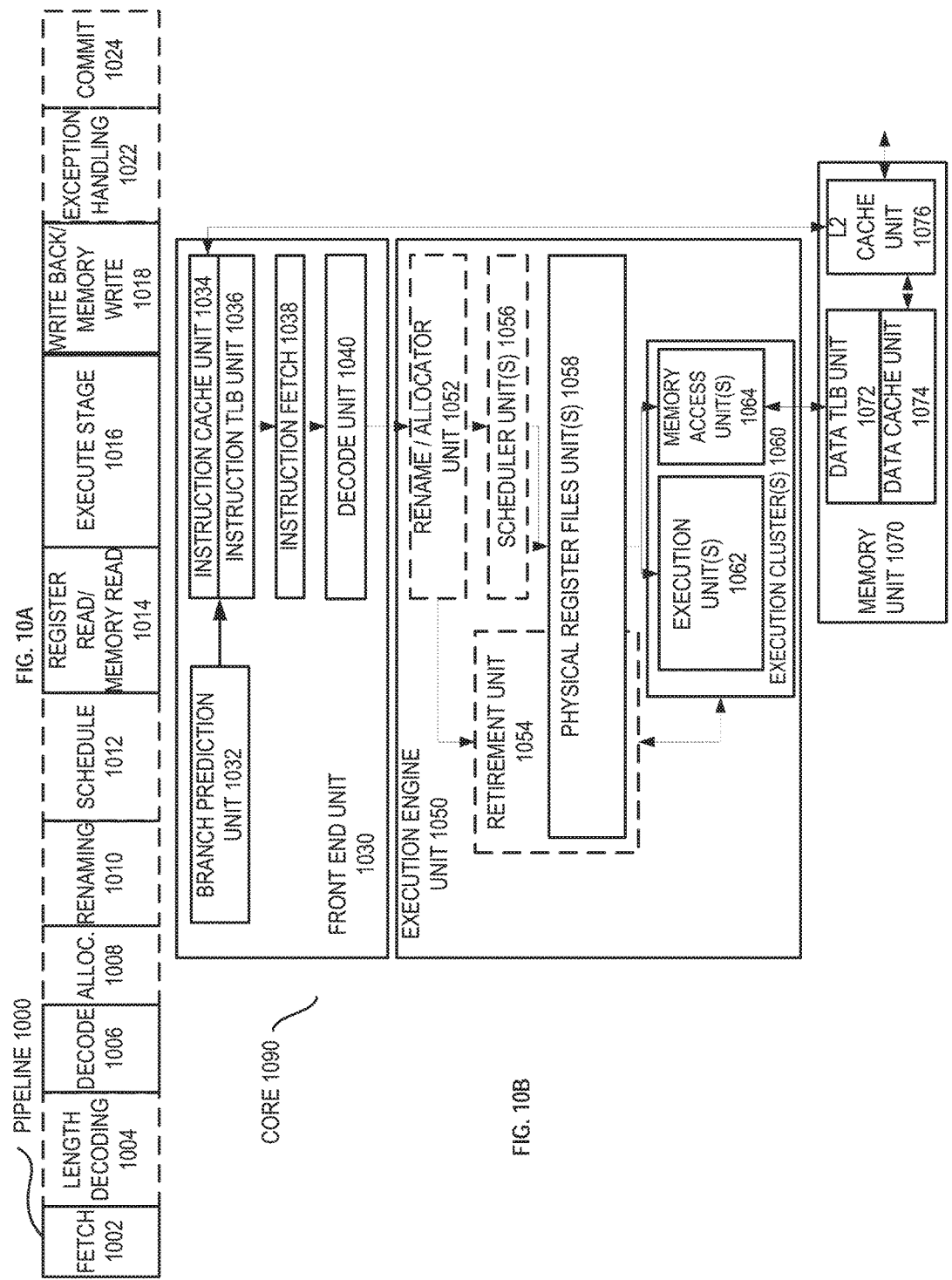

HARDWARE APPARATUSES AND METHODS TO CHECK DATA STORAGE DEVICES FOR TRANSIENT FAULTS

CROSS-REFERENCE TO RELATED APPLICATIONS

The present patent application is a continuation application claiming priority from U.S. patent application Ser. No. 14/751,113, filed Jun. 25, 2015, and titled: "Hardware Apparatuses and Methods to Check Data Storage Devices for Transient Faults", which is incorporated herein by reference in its entirety.

TECHNICAL FIELD

The disclosure relates generally to electronics, and, more specifically, an embodiment of the disclosure relates to an integrated circuit to check data storage devices for transient faults.

BACKGROUND

A processor, or set of processors, executes instructions from an instruction set, e.g., the instruction set architecture (ISA). The instruction set is the part of the computer architecture related to programming, and generally includes the native data types, instructions, register architecture, addressing modes, memory architecture, interrupt and exception handling, and external input and output (I/O). A processor may include or include access to a data storage device. A processor may perform operation(s) on data from the data storage device.

BRIEF DESCRIPTION OF THE DRAWINGS

The present disclosure is illustrated by way of example and not limitation in the figures of the accompanying drawings, in which like references indicate similar elements and in which:

FIG. 8A is a block diagram illustrating fields for the generic vector friendly instruction formats in FIGS. 7A and 7B according to embodiments of the disclosure.

FIG. 8B is a block diagram illustrating the fields of the specific vector friendly instruction format in FIG. 8A that make up a full opcode field according to one embodiment of the disclosure.

FIG. 8C is a block diagram illustrating the fields of the specific vector friendly instruction format in FIG. 8A that make up a register index field according to one embodiment of the disclosure.

FIG. 8D is a block diagram illustrating the fields of the specific vector friendly instruction format in FIG. 8A that make up the augmentation operation field 750 according to one embodiment of the disclosure.

FIG. 10A is a block diagram illustrating both an exemplary in-order pipeline and an exemplary register renaming, out-of-order issue/execution pipeline according to embodiments of the disclosure.

FIG. 10B is a block diagram illustrating both an exemplary embodiment of an in-order architecture core and an exemplary register renaming, out-of-order issue/execution architecture core to be included in a processor according to embodiments of the disclosure.

DETAILED DESCRIPTION

Figure 1:
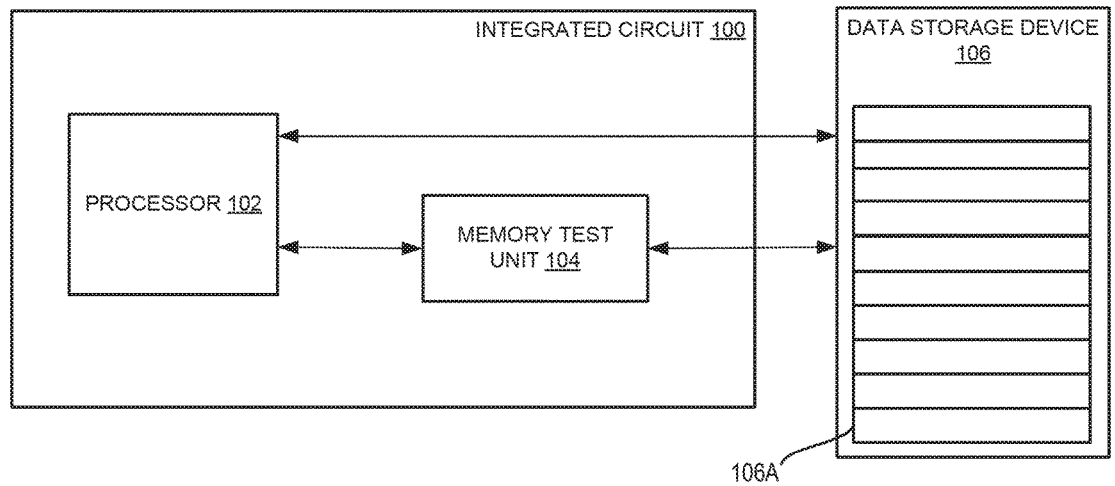
FIG. 1 illustrates an integrated circuit including a memory test unit according to embodiments of the disclosure.

In the following description, numerous specific details are set forth. However, it is understood that embodiments of the disclosure may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Instruction processing hardware (e.g., a hardware processor having one or more cores to decode and/or execute instructions) may operate on data, e.g., in performing arithmetic or logic functions. In one embodiment, the data is in vector form, e.g., having multiple elements that are managed as a unit for coherence purposes. In one embodiment, each element is a cache line. Each element of data may be a single cache line or multiple cache lines. Each section of data may be a plurality of cache lines, e.g., a multiple of a cache line size. A section of data may be multiple data vectors.

A processor may access (e.g., load and/or store) data in a (e.g., separate from the processor die) data storage device. A data storage device may be system memory, e.g., random-access memory (RAM). A data storage device may not include a processor cache and/or not include external storage, such as, but not limited to, hard disk drive (HDD) storage. A data storage device, e.g., a location in the data storage device, may have an error. An error may be a transient fault, e.g., a soft error. An error may be a permanent fault, e.g., a hard error. An error at a location in a data storage device may cause a processor accessing that location to return incorrect information.

A processor (e.g., its architecture) may include hardware for detection and/or logging of a machine check exemption (MCE) error, e.g., to propagate serious error events for logging and handling of recovery from the error in cases that permit (e.g., software) intervention to recover. An MCE signal (e.g., on detection of a MCE error) may be broadcast to all (e.g., other than the issuing core) cores in a multiple core processor. In one embodiment, the processor (e.g., architecture) may permit only one error to prevail in a system at a given time, e.g., if there is more than one MCE signal, the processor may view this as unacceptable and may initiate a shutdown action by the hardware (e.g., with no software involvement). In one embodiment, a processor (e.g., architecture) may include hardware to allow for recoverable machine check errors. Although certain error(s) may be recoverable, other error(s) may cause a processor shutdown.

Certain data storage devices, such as phase change memory (PCM) or other memristor data storage devices, may be non-volatile memory that also is used as system memory, for example, to replace disk drives and/or replace the volatile (e.g., RAM) system memory. In one embodiment, when data is being accessed by a processor at a section (e.g., a cache line) of a data storage device that includes an error, this may cause the processor to issue an MCE signal, e.g., which may cause the processor to shut down.

Certain embodiments of this disclosure may provide a hardware memory test unit to test any memory independent of the type of memory technology (e.g., PCM) and/or independent of the operating system (OS) executing on the processor. Certain embodiments of this disclosure include a memory test unit to perform a check (e.g., scrub) of a (e.g., section of a) data storage device, for example, before the processor accesses the data storage device. Certain embodiments of the disclosure include a memory test unit to perform a check (e.g., scrub) of a (e.g., section of a) data storage device, for example, checking data stored in the data storage device before that data is loaded into the processor from the data storage device.

Certain embodiment provide a memory test unit to clear a section of (e.g., a cache line of) a data storage device having an error. For example, a memory test unit may clear an error condition (for example, a poisoned line which may be indicated by a poison bit, e.g., set by the processor) and may perform a test after clearing the error condition to confirm that the error was transient in nature, e.g., so that section of the data storage device may be reused. Certain embodiments of this disclosure may directly recover, e.g., instead of relying on the operating system to recover, from an error. In one embodiment, the memory test unit of a processor may directly test (e.g., and recover) the user space of a data storage device (e.g., system memory) and/or the kernel space of a data storage device (e.g., system memory). In one embodiment, the kernel space of a data storage device is where the operating system executes. In one embodiment, the user space of a data storage device is where the user processes execute, e.g., the processes other than the operating system. In one embodiment, an instruction that (e.g., when executed by a processor) causes the memory test unit to perform the check(s) discussed herein may be exposed to (e.g., usable by) an operating system, e.g., exposed to a guest operating system in a virtual machine.

FIG. 1 illustrates an integrated circuit 100 including a memory test unit 104 according to embodiments of the disclosure. Integrated circuit 100 includes a processor 102. Processor 102 may have one or a plurality of cores. Processor may be a processor as discussed in reference to the other figures. Processor may include a decode unit (decoder) and an execution unit, e.g., to decode and execute an instruction, respectively. Integrated circuit 100 may include a memory test unit 104. Integrated circuit 100 may access a separate data storage device 106 (e.g., as depicted in FIG. 1) or, additionally or alternatively, include (not depicted) a data storage device. Data storage device 106 may include multiple (e.g., processor addressable) data elements, e.g., such as data element 106A. In one embodiment, a (e.g., each) data element 106A may be the size of a cache line (e.g., 32 bytes or 64 bytes). Processor may access (e.g., load and/or store) data in data storage device 106.

Note that a double headed arrow herein may not require two-way communication, for example, it may indicate one-way communication (e.g., to or from that component). Any or all combinations of communications paths may be utilized in embodiments herein. Data storage device may be of any size and/or any number of discrete storage elements.

Depicted memory test unit 104 includes a (e.g., dedicated) communication path with the processor 102 and with the data storage device 106. In one embodiment, a memory test unit 104 is a memory test hardware accelerator. For example, a memory test hardware accelerator may run independently of the processor, e.g., not utilizing the processing resources of the processor to perform the check. The memory test unit 104 may have direct memory access to the data storage device 106, for example, not utilizing a (e.g., memory controller of) processor.

Memory test unit may make a store of (e.g., test) data to a section of the data storage device and then a load to ensure the (e.g., test) data returned is correct (e.g., matching). Memory test unit may load data from the section of data storage device, and the data may indicate an (e.g., any) error(s) in the data and/or the data storage device. In one embodiment, memory test unit may load data from a data element (e.g., data element 106A), and the data may include a poison bit (e.g., previously placed there by a hardware component of the integrated circuit, for example, but not limited to, as metadata). Memory test unit may use any error checking technique, e.g., to determine if the data storage device has a (e.g., transient) fault therein. Memory test unit may be a separate component of the integrated circuit.

Memory test unit 104 may check the section (e.g., 106A) of the data storage device 106 for a (e.g., transient) fault before the data (e.g., the data to be operated on by the processor 102) is stored in the section of the data storage device. In one embodiment, a transient fault may cause a machine check exception if accessed (e.g., operated on) by the processor. In one embodiment, the processor 102 (e.g., an instruction executed thereon) may request the memory test unit 104 check the data storage device 106. Memory test unit 104 may return a success indication to the processor 102 for a successful memory check, e.g., indicating the checked section of the data storage device 106 does not include any (e.g., transient) faults. Processor 102 may not allow usage of that section of the data storage device 106 until it receives a success indication (e.g., bit(s) being set, such as, but not limited to, a success bit) from the memory test unit 104 that the check was successful. Memory test unit 104 may return a failure indication to the processor 102 for a memory check that encountered a (e.g., transient) fault, e.g., indicating the checked section of the data storage device 106 includes any (e.g., transient) faults. A failure indication may be an (e.g., virtual) address where the transient fault occurred. Processor 102 may take an (e.g., corrective) action in response to a failure indication, such as, but not limited to, not using the portions of the data storage device that has a fault or attempting to re-check (e.g., all of that section of the data storage device or just those portions of the data storage device that were indicated as having a fault) the data storage device 106 for a (e.g., transient) fault.

Memory test unit 104 may return the address(es) of the portion(s) of the data storage device 106 that were indicated as having a fault therein. Memory test unit 104 may return the address of the first portion (e.g., cache line) of the data storage device 106 that is indicated as having a fault therein (e.g., and/or ending the check of the data storage device when encountering the first (e.g., transient) fault). An address may be a virtual or a physical address. In one embodiment, an address may be an offset from a known address, such as an offset from a starting (e.g., virtual) address (e.g., the start of the check) of the (e.g., transient) fault.

In one embodiment, the processor 102 may include a register to provide and/or receive information, for example, from the memory test unit 104. For example, a memory test unit 104 may load a register of the processor with one of a success indication and a fault indication, e.g., an address of the (e.g., transient) fault. A success indication may be a single (e.g., leading or trailing) bit or certain or all bits of the register being set (e.g., high or low).

In one embodiment, the processor 102 may provide the memory test unit 104 with the size of the section of the data storage device to be checked, for example, with a starting address and a size of the section (e.g., block) of the data storage device to be checked. In one embodiment, the size is the number of cache lines to be checked.

Memory test unit 104 may be utilized to check a section of a data storage device 106 for a (e.g., transient) fault before loading a database (e.g., of hundreds of cache lines of data). In one embodiment, this prevents a (e.g., transient) fault that may cause a machine check exception if accessed by the processor from reaching the processor. In one embodiment, memory test unit steps through the section of the data storage device to check for an error (e.g., without intervention from the processor) and may then provide a completion status (e.g., a success indication or a failure indication), for example, after the scan is complete. For example, this may be achieved by a (e.g., direct memory access) memory test unit or by an instruction that (e.g., when decoded and/or executed) offloads the checking of the data storage device to the memory test unit and may provide an (e.g., asynchronous or non-blocking) notification when the check is complete. Memory test unit may be utilized without a computing system entering a system management mode (SMM) and/or utilizing the basic input/output system (BIOS).

Figure 2:
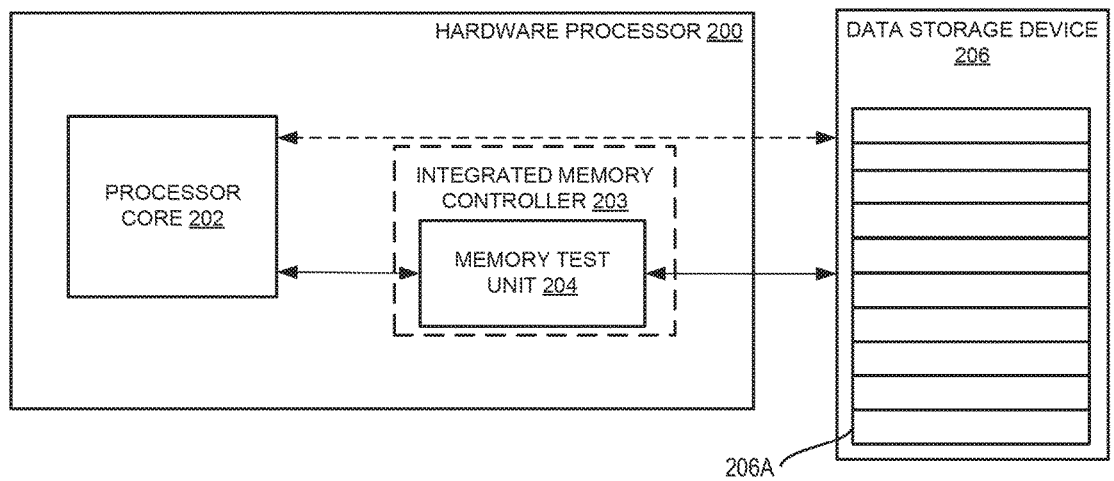
FIG. 2 illustrates a hardware processor including a memory test unit according to embodiments of the disclosure.

FIG. 2 illustrates a hardware processor 200 including a memory test unit 204 according to embodiments of the disclosure. Memory test unit 204 may be a part of an integrated memory controller 203 or may have direct memory access. Processor core 202 may access data storage device 206 (shown as a dotted line) directly or through integrated memory controller 203. Processor 200 includes a core 202. Processor 200 may have one or a plurality of cores. Processor may be a processor as discussed in reference to the other figures. Processor may include a decode unit (decoder) and an execution unit, e.g., to decode and execute an instruction, respectively. Processor 200 may include a memory test unit 204. Processor 200 may access a separate data storage device 206 (e.g., as depicted in FIG. 2) or include (not depicted) a data storage device. Data storage device 206 may include multiple (e.g., processor addressable) data elements 206A. In one embodiment, (e.g., each) data element 206A may be the size of a cache line (e.g., 32 bytes or 64 bytes). Processor may access (e.g., load and/or store) data in data storage device 206.

Note that a double headed arrow herein may not require two-way communication, for example, it may indicate one-way communication (e.g., to or from that component). Any or all combinations of communications paths may be utilized in embodiments herein.

Depicted memory test unit 204 includes a (e.g., dedicated) communication path with the processor core 202 and the data storage device 206. In one embodiment, a memory test unit 204 is a memory test hardware accelerator. For example, a memory test hardware accelerator may run independently of the processor core(s), e.g., not utilizing the resources of the processor core(s) to perform the check. The memory test unit 204 may have direct memory access to the data storage device 206, for example, not utilizing a (e.g., integrated memory controller 203 of) processor.

Memory test unit may make a store of (e.g., test) data to the section of the data storage device and then a load to ensure the (e.g., test) data returned is correct (e.g., matching). Memory test unit may load data from the section of data storage device, and the data may indicate an (e.g., any) error(s) in the data storage device. In one embodiment, memory test unit may load data from a data element (e.g., data element 206A), and the data may include a poison bit (e.g., previously placed there by a hardware component of the integrated circuit). Memory test unit may use any error checking technique, e.g., to determine if the data storage device has a (e.g., transient) fault therein. Memory test unit may be a separate component of the integrated circuit.

Memory test unit 204 may check the section (e.g., 206A) of the data storage device 206 for a (e.g., transient) fault before the data (e.g., the data to be operated on by the processor 200 and/or processor core 202) is stored in the section of the data storage device. In one embodiment, the transient fault will cause a machine check exception if accessed (e.g., operated on) by the processor and/or processor core. In one embodiment, the processor 200 and/or processor core 202 (e.g., by an instruction executed thereon) may request the memory test unit 204 check the data storage device 206. Memory test unit 204 may return a success indication to the processor 200 and/or processor core 202 for a successful memory check, e.g., indicating the checked section of the data storage device 206 does not include any (e.g., transient) faults. Processor 200 and/or processor core 202 may not allow usage of that section of the data storage device 206 until it receives a success indication (e.g., bit(s) being set, such as, but not limited to, a success bit) from the memory test unit 204 that the check was successful. Memory test unit 204 may return a failure indication to the processor 200 and/or processor core 202 for a memory check that encountered a (e.g., transient) fault, e.g., indicating the checked section of the data storage device 206 includes any (e.g., transient) faults. A failure indication may be an (e.g., virtual) address where the transient fault occurred. Processor 200 and/or processor core 202 may take an (e.g., corrective) action in response to a failure indication, such as, but not limited to, not using the portions of the data storage device that has a fault or attempting to re-check (e.g., all of the section of the data storage device or just those portions of the data storage device that were indicated as having a fault) the data storage device 206 for a (e.g., transient) fault.

Memory test unit 204 may return the address(es) of the portion(s) of the data storage device 206 that were indicated as having a fault therein. Memory test unit 204 may return the address of the first portion (e.g., cache line) of the data storage device 206 that is indicated as having a fault therein (e.g., and/or ending the check of the data storage device when encountering the first (e.g., transient) fault). An address may be a virtual or a physical address. In one embodiment, an address may be an offset from a known address, such as an offset from a starting (e.g., virtual) address (e.g., the start of the check) of the (e.g., transient) fault.

In one embodiment, the processor 200 and/or processor core 202 may include a register to provide and/or receive information, for example, from the memory test unit 204. For example, a memory test unit 204 may load a register of the processor 200 and/or processor core 202 with one of a success indication and a fault indication, e.g., an address of the (e.g., transient) fault. A success indication may be a single (e.g., leading or trailing) bit or certain or all bits of the register being set (e.g., high or low).

In one embodiment, the processor 200 and/or processor core 202 may provide the memory test unit 204 with the size of the section of the data storage device to be checked, for example, with a starting address and a size of the section (e.g., block) of the data storage device to be checked. In one embodiment, the size is the number of cache lines to be checked.

Memory test unit 204 may be utilized to check a section of data storage device 206 for a (e.g., transient) fault before loading a database (e.g., of hundreds of cache lines of data). In one embodiment, this prevents a (e.g., transient) fault that would cause a machine check exception if accessed by the processor 200 and/or processor core 202 from reaching the processor 200 and/or processor core 202. In one embodiment, memory test unit steps through the section of the data storage device to check for an error (e.g., without intervention from the processor) and may then provide a completion status (e.g., a success indication or a failure indication), for example, after the scan is complete. This may be achieved by a (e.g., direct memory access) memory test unit or by an instruction that (e.g., when decoded and/or executed) offloads the checking of the data storage device to the memory test unit and may provide an (e.g., asynchronous or non-blocking) notification when the check is complete.

In certain embodiments herein, an instruction (e.g., being decoded and/or executed) may cause a memory test unit to begin checking a section of a data storage device. In one embodiment, the instruction includes one or more fields (e.g., as an operand or operands) that indicate the size of the section of the data storage device where the check is to be performed and/or the location (e.g., address) where the check is to be performed. In one embodiment, the memory test unit may (e.g., also) check that the provided section to be checked has a starting (e.g., virtual) address that is cache line aligned and/or the size of the section (e.g., specified in bytes) is a multiple of the cache line size. The instruction may work in user space and/or kernel space of an operating system. When a memory test unit encounters a data storage device (e.g., memory) address with an error (e.g., transient fault), instead of throwing a machine check exception, the memory test unit may provide a completion status (e.g., a success indication or a failure indication), e.g., in a general purpose register. The instruction may (e.g., also) cause a hardware accelerator (e.g., separate from a core of the processor) to perform the check via offload, for example, using the same page table using shared virtual memory (SVM) type of interface of an input and output memory management unit (IOMMU) of a processor or integrated circuit that connects the memory test unit through a direct memory access-capable I/O bus to the data storage device, e.g., so as to not use processor cycles to perform this check. One example format of an instruction is an opcode of testmem and operands of the starting address and the length, e.g., testmem <address> <length>, to performs checking of data storage device (e.g., memory) starting at data storage device (e.g., memory) location <address> for <length> of bits or bytes. The execution (e.g., and retirement) of an instruction according to this disclosure may cause a completion status to be output without causing a machine check exception.

Figure 3:
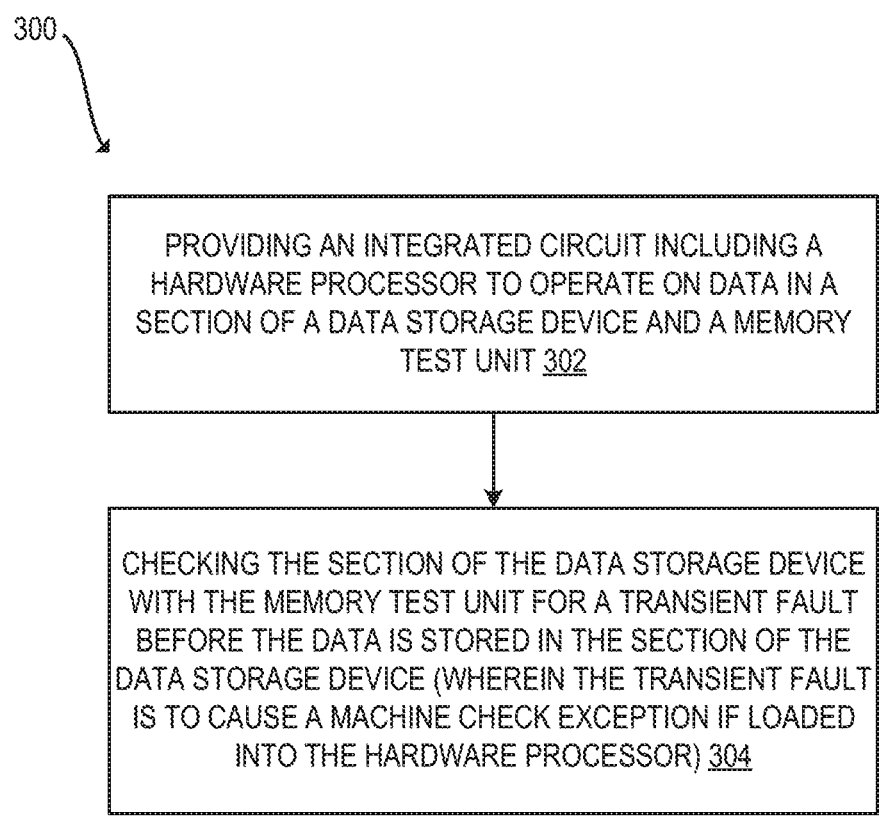
FIG. 3 illustrates a flow diagram of a memory test according to embodiments of the disclosure.

FIG. 3 illustrates a flow diagram 300 of a memory test according to embodiments of the disclosure. Flow diagram 300 includes providing an integrated circuit including a hardware processor to operate on data in a section of a data storage device and a memory test unit 302, and checking the section of the data storage device with the memory test unit for a transient fault before the data is stored in the section of the data storage device, wherein the transient fault is to cause a machine check exception if accessed by the hardware processor 304. Memory test unit may include logic, e.g., a finite state machine, that operates according to the flow diagram(s) herein.

Figure 4:
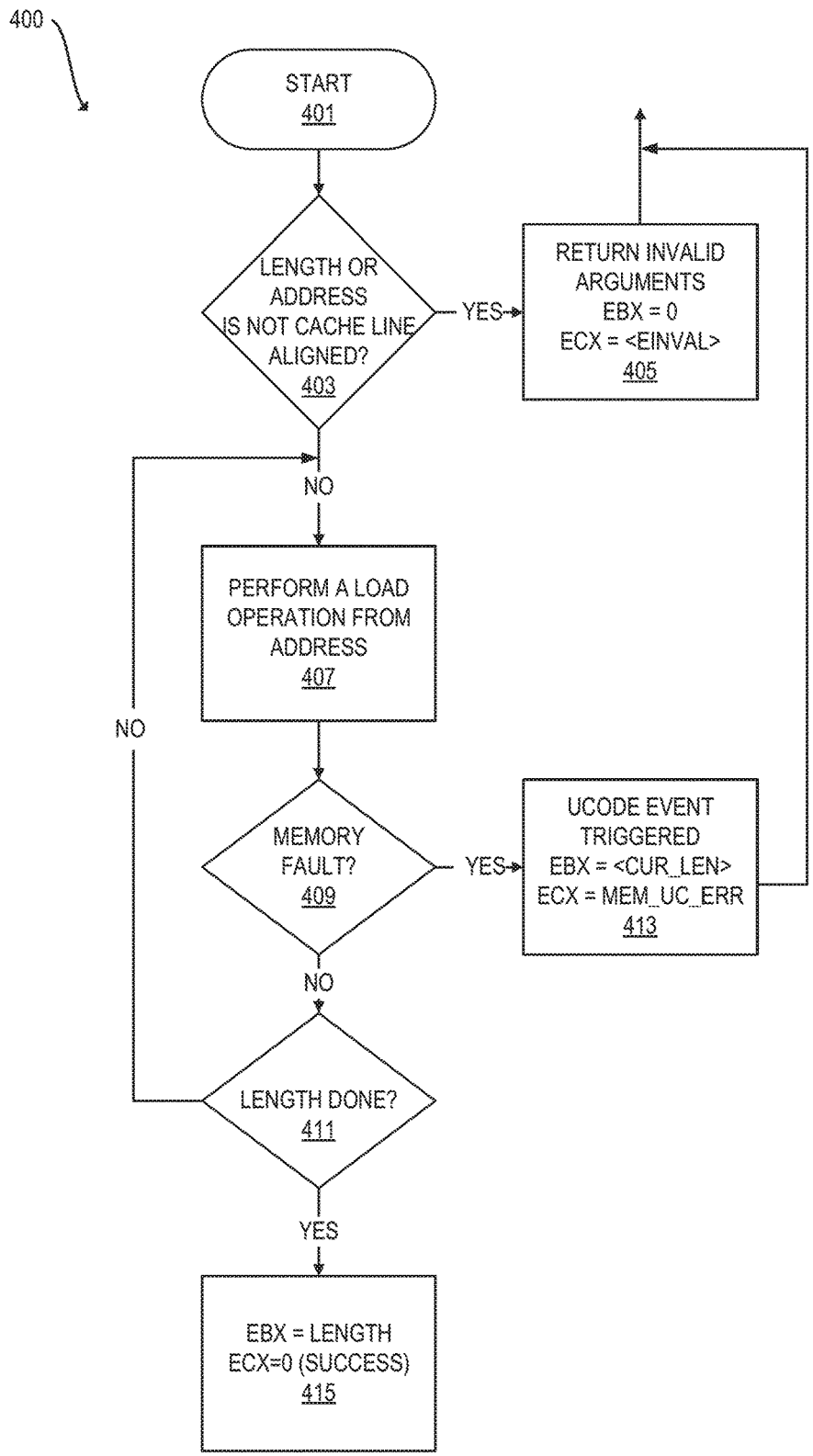
FIG. 4 illustrates a flow diagram of a memory test according to embodiments of the disclosure.

FIG. 4 illustrates a flow diagram 400 of a memory test according to embodiments of the disclosure. Memory test unit may start 401, for example, in response to a request to check a section of a data storage device. Memory test unit may then check to ensure that the length and/or the (e.g., starting) address provided for the section of the data storage device is cache line aligned 403. If the length or the address is not cache line aligned (e.g., yes in FIG. 4), the memory test unit may return an invalid argument indication, for example, by writing to a first register (e.g., listed as EBX as an example) a zero and writing to a second register (e.g., listed as ECX as an example) an indication that there is a cache line alignment error in the length or address (e.g., <EINVAL> as an example) 405. If the length and the address is cache line aligned (e.g., no in FIG. 4), the memory test unit may perform a load operation at the (e.g., starting) address provided to check for a fault 409. If there is a fault (yes), the memory test unit may return (e.g., via microcode) a failure (e.g., fault) indication, for example, depicted as writing to a first register (e.g., listed as EBX as an example) an address of the fault (e.g., <cur_length> or <offset>) and writing to a second register (e.g., listed as ECX as an example) an indication that there is an fault (e.g., MEM_UC_ERR) as an example) 413. If no fault if found, the memory test unit determines if the check of the section of the data storage is complete (e.g., length done) 411. If there are no faults in the entire section of the data storage, the memory test unit can return a success indication, for example, by writing to a first register (e.g., listed as EBX as an example) the length (e.g., from 403) and writing to a second register (e.g., listed as ECX as an example) a success indication that there is no fault therein (e.g., a zero in ECX as an example) 415. This may be utilized for a processor that does not support recovery from a machine check exception.

Figure 5:
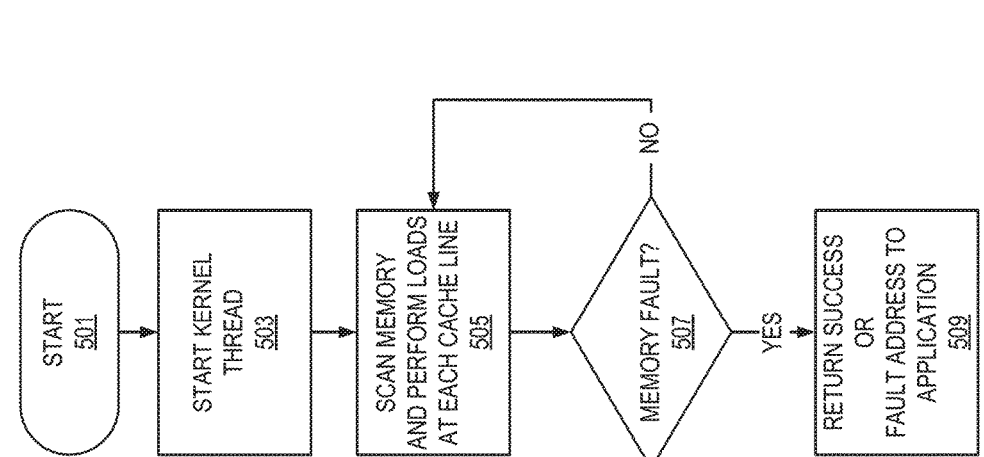
FIG. 5 illustrates a flow diagram of a memory test according to embodiments of the disclosure.

FIG. 5 illustrates a flow diagram 500 of a memory test according to embodiments of the disclosure. Memory test unit may start 501, for example, in response to a request to check a section of a data storage device. The memory test unit may check for an existing kernel thread or start a kernel thread 503 for the check of the section of the data storage device. The kernel thread may then cause a scan of the memory and load at each cache line to check for a (e.g., transient) fault 505. If there is a memory fault, the kernel then may return a fault address to the requestor 509. If there is no memory fault, each next cache line may then be iteratively checked 507 and when complete, a success indication may be returned 509.

Figure 6:
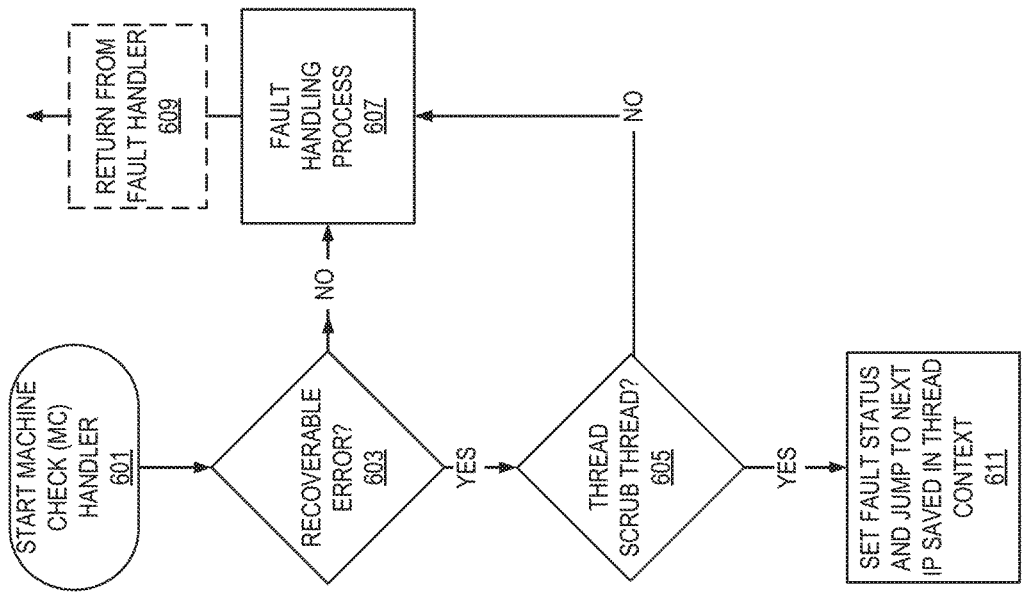
FIG. 6 illustrates a flow diagram of a memory test with a machine check handler according to embodiments of the disclosure.

FIG. 6 illustrates a flow diagram 600 of a memory test with a machine check handler according to embodiments of the disclosure. A machine check handler (e.g., of a processor) may be initiated 601, for example, in response to detecting a fault that triggers a machine check exemption. If the fault is not a recoverable error, a fault handling process may be initiated 607 and then a return from the fault handler 609 may occur, e.g., to the operation that was occurring when the machine check exemption occurred. If the fault is a recoverable error, a thread scrubbing operation (e.g., correcting the fault) may be initiated for the thread where the fault occurred 605. For example, the machine check handler may detect the faulting thread is the scrubbing thread (e.g., scrub thread), and arrange to return to the exception handler indicating that a memory fault has occurred. If the error detected was recoverable (e.g., yes in FIG. 6), the fault status may be set and a jump (e.g., longjmp) to the next instruction pointer (IP) in the thread context 611, e.g., setting up a return to 509. In one embodiment, the flow in FIG. 6 is that of an asynchronous machine check handler to check if the fault happened in the scrubbing thread (e.g., scrub thread). If so, the machine check handler may cause a jump (e.g., longjmp) to the faulting thread to make it appear as a synchronous error.

The flow diagrams in FIGS. 5 and 6 may be utilized for a processor that supports recovery from a machine check exception. For example, a kernel of the operating system may provide special casing by testing if the thread in question is the special kernel thread, or if there is a context already setup for this thread. In which case the fault handler may perform a jump to the registered address on return from the MC handler, for example, as shown in FIGS. 5 and 6. In one embodiment, the flow jumps from the flow in FIG. 6 to the flow in FIG. 5 if the error context indicates that the error signaled in the machine check handler is for the faulting thread.

When caching is utilized, a memory test unit may not involve processor cache(s) before performing the load. The memory test unit may cause a cache flush to be performed before the data storage device is checked (e.g., before any data is loaded from the data storage device).

When caching is utilized, a memory test unit may be utilized in a system with multiple level memory where the data storage device is slower to access (e.g., non-volatile RAM in one embodiment) than a processor's cache (e.g., DRAM in one embodiment). The memory test unit may ensure it is checking the far memory and not data coming from the DRAM. The memory test unit may send the request for a load with an extension to obtain the data from the real memory source. This may ensure the memory controller does not use the cache in DRAM but in fact performs a real fetch from far memory for the scan. This may be utilized where a request to flush the cache is not aware of cache resident out of the package as in the case with 2 level memory.

Methods and apparatuses of this disclosure include a hardware memory test unit to check a section of a data storage device for an error (e.g., a transient fault) before the data is stored in and/or loaded from the section of the data storage device.

In one embodiment, an integrated circuit comprises a hardware processor to operate on data in a section of a data storage device, and a memory test unit to check the section of the data storage device for a transient fault before the data is stored in the section of the data storage device, wherein the transient fault is to cause a machine check exception if accessed by the hardware processor. The data storage device may be a phase change data storage device. The memory test unit may check the section of the data storage device for the transient fault in response to an instruction provided to the hardware processor. The instruction may include a field to indicate a starting virtual address and a length of the section of the data storage device. The memory test unit may provide a success indication when no transient fault is in the section of the data storage device, and an offset from the starting virtual address of the transient fault when the transient fault is in the section of the data storage device. The memory test unit may provide a success indication when no transient fault is in the section of the data storage device, and an address of the transient fault when the transient fault is in the section of the data storage device. The section of the data storage device may be in a kernel space of an operating system. The memory test unit comprises direct memory access to the data storage device.

In another embodiment, a method includes providing an integrated circuit including a hardware processor to operate on data in a section of a data storage device and a memory test unit, and checking the section of the data storage device with the memory test unit for a transient fault before the data is stored in the section of the data storage device, wherein the transient fault is to cause a machine check exception if accessed by the hardware processor. The data storage device may be a phase change data storage device. The method may further comprise checking the section of the data storage device for the transient fault in response to an instruction provided to the hardware processor. The method may further comprise including a field of the instruction to indicate a starting virtual address and a length of the section of the data storage device. The method may further comprise providing a success indication when no transient fault is in the section of the data storage device, and providing an offset from the starting virtual address of the transient fault when the transient fault is in the section of the data storage device. The method may further comprise providing a success indication when no transient fault is in the section of the data storage device, and providing an address of the transient fault when the transient fault is in the section of the data storage device. The section of the data storage device may be in a kernel space of an operating system executing on the hardware processor. The memory test unit may comprise direct memory access to the data storage device.

In yet another embodiment, an apparatus comprises a data storage device that stores code that when executed by a hardware processor causes the hardware processor to perform any method disclosed herein.

In another embodiment, a hardware processor comprises a processor core to operate on data in a section of a data storage device, and a memory test unit to check the section of the data storage device for a transient fault before the data is stored in the section of the data storage device, wherein the transient fault is to cause a machine check exception if accessed by the processor core. The data storage device may be a phase change data storage device. The memory test unit may check the section of the data storage device for the transient fault in response to an instruction provided to the hardware processor. The instruction may include a field to indicate a starting virtual address and/or a length of the section of the data storage device. The memory test unit may provide a success indication when no transient fault is in the section of the data storage device, and/or an offset from the starting virtual address of the transient fault when the transient fault is in the section of the data storage device. The memory test unit may provide a success indication when no transient fault is in the section of the data storage device, and/or an address of the transient fault when the transient fault is in the section of the data storage device. The section of the data storage device may be in a kernel space of an operating system. The memory test unit may comprise direct memory access to the data storage device.

In yet another embodiment, a hardware apparatus comprises a hardware processor to operate on data in a section of a data storage device, and means to check the section of the data storage device for a transient fault before the data is stored in the section of the data storage device, wherein the transient fault is to cause a machine check exception if accessed by the hardware processor.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, April 2015; and see Intel® Architecture Instruction Set Extensions Programming Reference, October 2014).

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 7A:
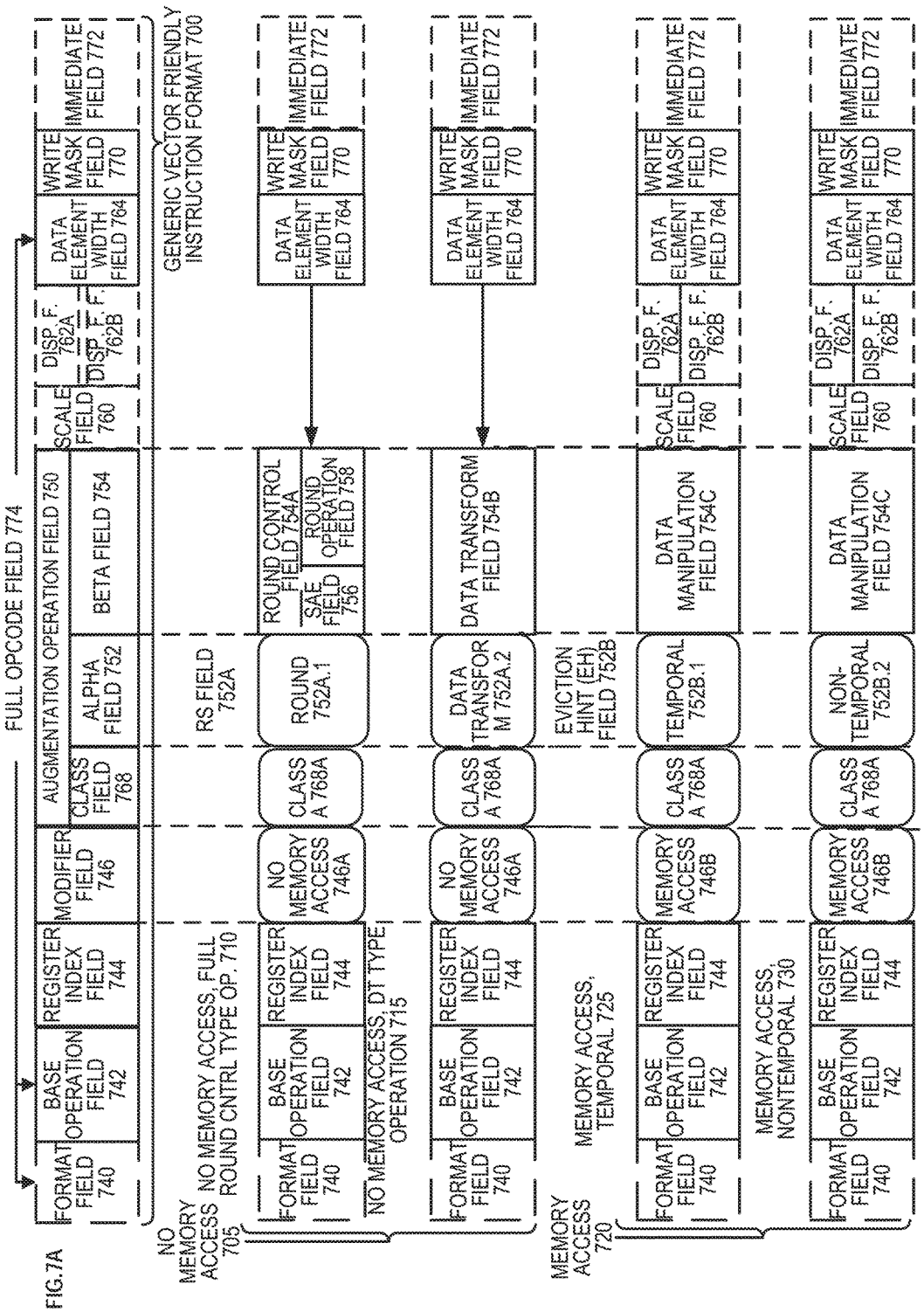
FIG. 7A is a block diagram illustrating a generic vector friendly instruction format and class A instruction templates thereof according to embodiments of the disclosure.
Figure 7B:
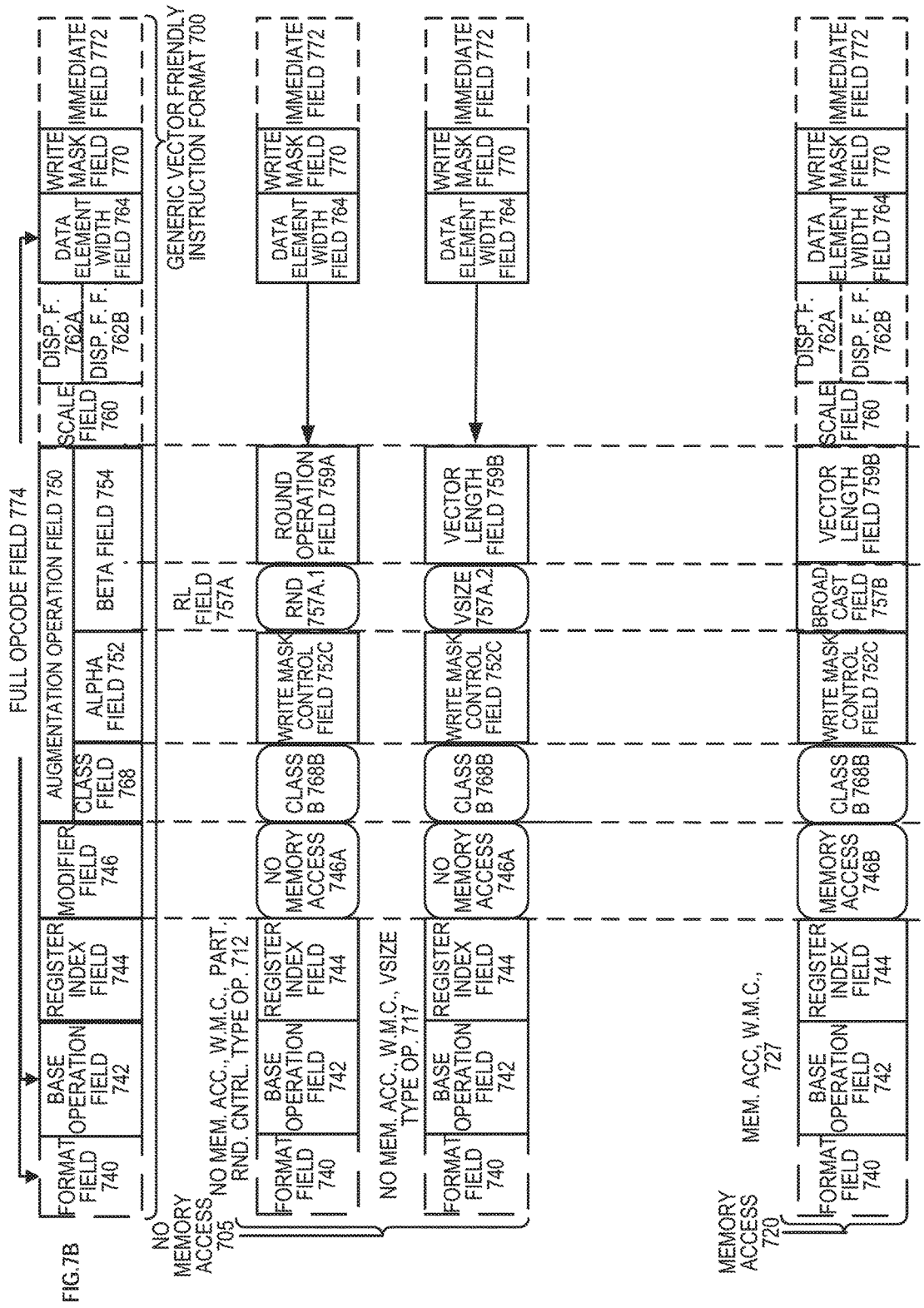
FIG. 7B is a block diagram illustrating the generic vector friendly instruction format and class B instruction templates thereof according to embodiments of the disclosure.

FIGS. 7A-7B are block diagrams illustrating a generic vector friendly instruction format and instruction templates thereof according to embodiments of the disclosure. FIG. 7A is a block diagram illustrating a generic vector friendly instruction format and class A instruction templates thereof according to embodiments of the disclosure; while FIG. 7B is a block diagram illustrating the generic vector friendly instruction format and class B instruction templates thereof according to embodiments of the disclosure. Specifically, a generic vector friendly instruction format 700 for which are defined class A and class B instruction templates, both of which include no memory access 705 instruction templates and memory access 720 instruction templates. The term generic in the context of the vector friendly instruction format refers to the instruction format not being tied to any specific instruction set.

While embodiments of the disclosure will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 7A include: 1) within the no memory access 705 instruction templates there is shown a no memory access, full round control type operation 710 instruction template and a no memory access, data transform type operation 715 instruction template; and 2) within the memory access 720 instruction templates there is shown a memory access, temporal 725 instruction template and a memory access, non-temporal 730 instruction template. The class B instruction templates in FIG. 7B include: 1) within the no memory access 705 instruction templates there is shown a no memory access, write mask control, partial round control type operation 712 instruction template and a no memory access, write mask control, vsize type operation 717 instruction template; and 2) within the memory access 720 instruction templates there is shown a memory access, write mask control 727 instruction template.

The generic vector friendly instruction format 700 includes the following fields listed below in the order illustrated in FIGS. 7A-7B.

Format field 740—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 742—its content distinguishes different base operations.

Register index field 744—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 746—its content distinguishes occurrences of instructions in the generic vector instruction format that specify memory access from those that do not; that is, between no memory access 705 instruction templates and memory access 720 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 750—its content distinguishes which one of a variety of different operations to be performed in addition to the base operation. This field is context specific. In one embodiment of the disclosure, this field is divided into a class field 768, an alpha field 752, and a beta field 754. The augmentation operation field 750 allows common groups of operations to be performed in a single instruction rather than 2, 3, or 4 instructions.

Scale field 760—its content allows for the scaling of the index field's content for memory address generation (e.g., for address generation that uses 2scale*index+base).

Displacement Field 762A—its content is used as part of memory address generation (e.g., for address generation that uses 2scale*index+base+displacement).

Displacement Factor Field 762B (note that the juxtaposition of displacement field 762A directly over displacement factor field 762B indicates one or the other is used)—its content is used as part of address generation; it specifies a displacement factor that is to be scaled by the size of a memory access (N)—where N is the number of bytes in the memory access (e.g., for address generation that uses 2scale*index+base+scaled displacement). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 774 (described later herein) and the data manipulation field 754C. The displacement field 762A and the displacement factor field 762B are optional in the sense that they are not used for the no memory access 705 instruction templates and/or different embodiments may implement only one or none of the two.

Data element width field 764—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 770—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 770 allows for partial vector operations, including loads, stores, arithmetic, logical, etc. While embodiments of the disclosure are described in which the write mask field's 770 content selects one of a number of write mask registers that contains the write mask to be used (and thus the write mask field's 770 content indirectly identifies that masking to be performed), alternative embodiments instead or additional allow the mask write field's 770 content to directly specify the masking to be performed.

Immediate field 772—its content allows for the specification of an immediate. This field is optional in the sense that is it not present in an implementation of the generic vector friendly format that does not support immediate and it is not present in instructions that do not use an immediate.

Class field 768—its content distinguishes between different classes of instructions. With reference to FIGS. 7A-B, the contents of this field select between class A and class B instructions. In FIGS. 7A-B, rounded corner squares are used to indicate a specific value is present in a field (e.g., class A 768A and class B 768B for the class field 768 respectively in FIGS. 7A-B).

Instruction Templates of Class A

In the case of the non-memory access 705 instruction templates of class A, the alpha field 752 is interpreted as an RS field 752A, whose content distinguishes which one of the different augmentation operation types are to be performed (e.g., round 752A.1 and data transform 752A.2 are respectively specified for the no memory access, round type operation 710 and the no memory access, data transform type operation 715 instruction templates), while the beta field 754 distinguishes which of the operations of the specified type is to be performed. In the no memory access 705 instruction templates, the scale field 760, the displacement field 762A, and the displacement scale filed 762B are not present.

No-Memory Access Instruction Templates—Full Round Control Type Operation

In the no memory access full round control type operation 710 instruction template, the beta field 754 is interpreted as a round control field 754A, whose content(s) provide static rounding. While in the described embodiments of the disclosure the round control field 754A includes a suppress all floating point exceptions (SAE) field 756 and a round operation control field 758, alternative embodiments may support may encode both these concepts into the same field or only have one or the other of these concepts/fields (e.g., may have only the round operation control field 758).

SAE field 756—its content distinguishes whether or not to disable the exception event reporting; when the SAE field's 756 content indicates suppression is enabled, a given instruction does not report any kind of floating-point exception flag and does not raise any floating point exception handler.

Round operation control field 758—its content distinguishes which one of a group of rounding operations to perform (e.g., Round-up, Round-down, Round-towards-zero and Round-to-nearest). Thus, the round operation control field 758 allows for the changing of the rounding mode on a per instruction basis. In one embodiment of the disclosure where a processor includes a control register for specifying rounding modes, the round operation control field's 750 content overrides that register value.

No Memory Access Instruction Templates—Data Transform Type Operation

In the no memory access data transform type operation 715 instruction template, the beta field 754 is interpreted as a data transform field 754B, whose content distinguishes which one of a number of data transforms is to be performed (e.g., no data transform, swizzle, broadcast).

In the case of a memory access 720 instruction template of class A, the alpha field 752 is interpreted as an eviction hint field 752B, whose content distinguishes which one of the eviction hints is to be used (in FIG. 7A, temporal 752B.1 and non-temporal 752B.2 are respectively specified for the memory access, temporal 725 instruction template and the memory access, non-temporal 730 instruction template), while the beta field 754 is interpreted as a data manipulation field 754C, whose content distinguishes which one of a number of data manipulation operations (also known as primitives) is to be performed (e.g., no manipulation; broadcast; up conversion of a source; and down conversion of a destination). The memory access 720 instruction templates include the scale field 760, and optionally the displacement field 762A or the displacement scale field 762B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 752 is interpreted as a write mask control (Z) field 752C, whose content distinguishes whether the write masking controlled by the write mask field 770 should be a merging or a zeroing.

In the case of the non-memory access 705 instruction templates of class B, part of the beta field 754 is interpreted as an RL field 757A, whose content distinguishes which one of the different augmentation operation types are to be performed (e.g., round 757A.1 and vector length (VSIZE) 757A.2 are respectively specified for the no memory access, write mask control, partial round control type operation 712 instruction template and the no memory access, write mask control, VSIZE type operation 717 instruction template), while the rest of the beta field 754 distinguishes which of the operations of the specified type is to be performed. In the no memory access 705 instruction templates, the scale field 760, the displacement field 762A, and the displacement scale filed 762B are not present.

In the no memory access, write mask control, partial round control type operation 710 instruction template, the rest of the beta field 754 is interpreted as a round operation field 759A and exception event reporting is disabled (a given instruction does not report any kind of floating-point exception flag and does not raise any floating point exception handler).

Round operation control field 759A—just as round operation control field 758, its content distinguishes which one of a group of rounding operations to perform (e.g., Round-up, Round-down, Round-towards-zero and Round-to-nearest). Thus, the round operation control field 759A allows for the changing of the rounding mode on a per instruction basis. In one embodiment of the disclosure where a processor includes a control register for specifying rounding modes, the round operation control field's 750 content overrides that register value.

In the no memory access, write mask control, VSIZE type operation 717 instruction template, the rest of the beta field 754 is interpreted as a vector length field 759B, whose content distinguishes which one of a number of data vector lengths is to be performed on (e.g., 128, 256, or 512 byte).

In the case of a memory access 720 instruction template of class B, part of the beta field 754 is interpreted as a broadcast field 757B, whose content distinguishes whether or not the broadcast type data manipulation operation is to be performed, while the rest of the beta field 754 is interpreted the vector length field 759B. The memory access 720 instruction templates include the scale field 760, and optionally the displacement field 762A or the displacement scale field 762B.

With regard to the generic vector friendly instruction format 700, a full opcode field 774 is shown including the format field 740, the base operation field 742, and the data element width field 764. While one embodiment is shown where the full opcode field 774 includes all of these fields, the full opcode field 774 includes less than all of these fields in embodiments that do not support all of them. The full opcode field 774 provides the operation code (opcode).

The augmentation operation field 750, the data element width field 764, and the write mask field 770 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the disclosure, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the disclosure). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the disclosure. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format

FIG. 8 is a block diagram illustrating an exemplary specific vector friendly instruction format according to embodiments of the disclosure. FIG. 8 shows a specific vector friendly instruction format 800 that is specific in the sense that it specifies the location, size, interpretation, and order of the fields, as well as values for some of those fields. The specific vector friendly instruction format 800 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 7 into which the fields from FIG. 8 map are illustrated.

It should be understood that, although embodiments of the disclosure are described with reference to the specific vector friendly instruction format 800 in the context of the generic vector friendly instruction format 700 for illustrative purposes, the disclosure is not limited to the specific vector friendly instruction format 800 except where claimed. For example, the generic vector friendly instruction format 700 contemplates a variety of possible sizes for the various fields, while the specific vector friendly instruction format 800 is shown as having fields of specific sizes. By way of specific example, while the data element width field 764 is illustrated as a one bit field in the specific vector friendly instruction format 800, the disclosure is not so limited (that is, the generic vector friendly instruction format 700 contemplates other sizes of the data element width field 764).

The generic vector friendly instruction format 700 includes the following fields listed below in the order illustrated in FIG. 8A.

EVEX Prefix (Bytes 0-3) 802—is encoded in a four-byte form.

Format Field 740 (EVEX Byte 0, bits [7:0])—the first byte (EVEX Byte 0) is the format field 740 and it contains 0x62 (the unique value used for distinguishing the vector friendly instruction format in one embodiment of the disclosure).

The second-fourth bytes (EVEX Bytes 1-3) include a number of bit fields providing specific capability.

REX field 805 (EVEX Byte 1, bits [7-5])—consists of a EVEX.R bit field (EVEX Byte 1, bit [7]—R), EVEX.X bit field (EVEX byte 1, bit [6]—X), and 757BEX byte 1, bit[5]—B). The EVEX.R, EVEX.X, and EVEX.B bit fields provide the same functionality as the corresponding VEX bit fields, and are encoded using is complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 710—this is the first part of the REX' field 710 and is the EVEX.R' bit field (EVEX Byte 1, bit [4]—R') that is used to encode either the upper 16 or lower 16 of the extended 32 register set. In one embodiment of the disclosure, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the disclosure do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 815 (EVEX byte 1, bits [3:0]—mmmm)—its content encodes an implied leading opcode byte (OF, OF 38, or OF 3).

Data element width field 764 (EVEX byte 2, bit [7]—W)—is represented by the notation EVEX.W. EVEX.W is used to define the granularity (size) of the datatype (either 32-bit data elements or 64-bit data elements).

EVEX.vvvv 820 (EVEX Byte 2, bits [6:3]—vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in is complement form for certain vector shifts; or 3) EVEX.vvvv does not encode any operand, the field is reserved and should contain 1111b. Thus, EVEX.vvvv field 820 encodes the 4 low-order bits of the first source register specifier stored in inverted (1s complement) form. Depending on the instruction, an extra different EVEX bit field is used to extend the specifier size to 32 registers.

EVEX.U 768 Class field (EVEX byte 2, bit [2]—U)—If EVEX.U=0, it indicates class A or EVEX.U0; if EVEX.U=1, it indicates class B or EVEX.U1.

Prefix encoding field 825 (EVEX byte 2, bits [1:0]—pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 752 (EVEX byte 3, bit [7]—EH; also known as EVEX.EH, EVEX.rs, EVEX.RL, EVEX.write mask control, and EVEX.N; also illustrated with a)—as previously described, this field is context specific.

Beta field 754 (EVEX byte 3, bits [6:4]—SSS, also known as EVEX.s2-0, EVEX.r2-0, EVEX.rr1, EVEX.LL0, EVEX.LLB; also illustrated with βββ)—as previously described, this field is context specific.

REX' field 710—this is the remainder of the REX' field and is the EVEX.V' bit field (EVEX Byte 3, bit [3]—V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 770 (EVEX byte 3, bits [2:0]—kkk)—its content specifies the index of a register in the write mask registers as previously described. In one embodiment of the disclosure, the specific value EVEX kkk=000 has a special behavior implying no write mask is used for the particular instruction (this may be implemented in a variety of ways including the use of a write mask hardwired to all ones or hardware that bypasses the masking hardware).

Real Opcode Field 830 (Byte 4) is also known as the opcode byte. Part of the opcode is specified in this field.

MOD R/M Field 840 (Byte 5) includes MOD field 842, Reg field 844, and R/M field 846. As previously described, the MOD field's 842 content distinguishes between memory access and non-memory access operations. The role of Reg field 844 can be summarized to two situations: encoding either the destination register operand or a source register operand, or be treated as an opcode extension and not used to encode any instruction operand. The role of R/M field 846 may include the following: encoding the instruction operand that references a memory address, or encoding either the destination register operand or a source register operand.

Scale, Index, Base (SIB) Byte (Byte 6)—As previously described, the scale field's 750 content is used for memory address generation. SIB.xxx 854 and SIB.bbb 856—the contents of these fields have been previously referred to with regard to the register indexes Xxxx and Bbbb.

Displacement field 762A (Bytes 7-10)—when MOD field 842 contains 10, bytes 7-10 are the displacement field 762A, and it works the same as the legacy 32-bit displacement (disp32) and works at byte granularity.

Displacement factor field 762B (Byte 7)—when MOD field 842 contains 01, byte 7 is the displacement factor field 762B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 762B is a reinterpretation of disp8; when using displacement factor field 762B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 762B substitutes the legacy x86 instruction set 8-bit displacement. Thus, the displacement factor field 762B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset). Immediate field 772 operates as previously described.

Full Opcode Field

FIG. 8B is a block diagram illustrating the fields of the specific vector friendly instruction format 800 that make up the full opcode field 774 according to one embodiment of the disclosure. Specifically, the full opcode field 774 includes the format field 740, the base operation field 742, and the data element width (W) field 764. The base operation field 742 includes the prefix encoding field 825, the opcode map field 815, and the real opcode field 830.

Register Index Field

FIG. 8C is a block diagram illustrating the fields of the specific vector friendly instruction format 800 that make up the register index field 744 according to one embodiment of the disclosure. Specifically, the register index field 744 includes the REX field 805, the REX' field 810, the MODR/M.reg field 844, the MODR/M.r/m field 846, the VVVV field 820, xxx field 854, and the bbb field 856.

Augmentation Operation Field

FIG. 8D is a block diagram illustrating the fields of the specific vector friendly instruction format 800 that make up the augmentation operation field 750 according to one embodiment of the disclosure. When the class (U) field 768 contains 0, it signifies EVEX.U0 (class A 768A); when it contains 1, it signifies EVEX.U1 (class B 768B). When U=0 and the MOD field 842 contains 11 (signifying a no memory access operation), the alpha field 752 (EVEX byte 3, bit [7]—EH) is interpreted as the rs field 752A. When the rs field 752A contains a 1 (round 752A.1), the beta field 754 (EVEX byte 3, bits [6:4]—SSS) is interpreted as the round control field 754A. The round control field 754A includes a one bit SAE field 756 and a two bit round operation field 758. When the rs field 752A contains a 0 (data transform 752A.2), the beta field 754 (EVEX byte 3, bits [6:4]—SSS) is interpreted as a three bit data transform field 754B. When U=0 and the MOD field 842 contains 00, 01, or 10 (signifying a memory access operation), the alpha field 752 (EVEX byte 3, bit [7]—EH) is interpreted as the eviction hint (EH) field 752B and the beta field 754 (EVEX byte 3, bits [6:4]—SSS) is interpreted as a three bit data manipulation field 754C.

When U=1, the alpha field 752 (EVEX byte 3, bit [7]—EH) is interpreted as the write mask control (Z) field 752C. When U=1 and the MOD field 842 contains 11 (signifying a no memory access operation), part of the beta field 754 (EVEX byte 3, bit [4]—$S_0$) is interpreted as the RL field 757A; when it contains a 1 (round 757A.1) the rest of the beta field 754 (EVEX byte 3, bit [6-5]—$S_{2-1}$) is interpreted as the round operation field 759A, while when the RL field 757A contains a 0 (VSIZE 757.A2) the rest of the beta field 754 (EVEX byte 3, bit [6-5]—$S_{2-1}$) is interpreted as the vector length field 759B (EVEX byte 3, bit [6-5]—$L_{1-0}$). When U=1 and the MOD field 842 contains 00, 01, or 10 (signifying a memory access operation), the beta field 754 (EVEX byte 3, bits [6:4]—SSS) is interpreted as the vector length field 759B (EVEX byte 3, bit [6-5]—$L_{1-0}$) and the broadcast field 757B (EVEX byte 3, bit [4]—B).

Exemplary Register Architecture

Figure 9:
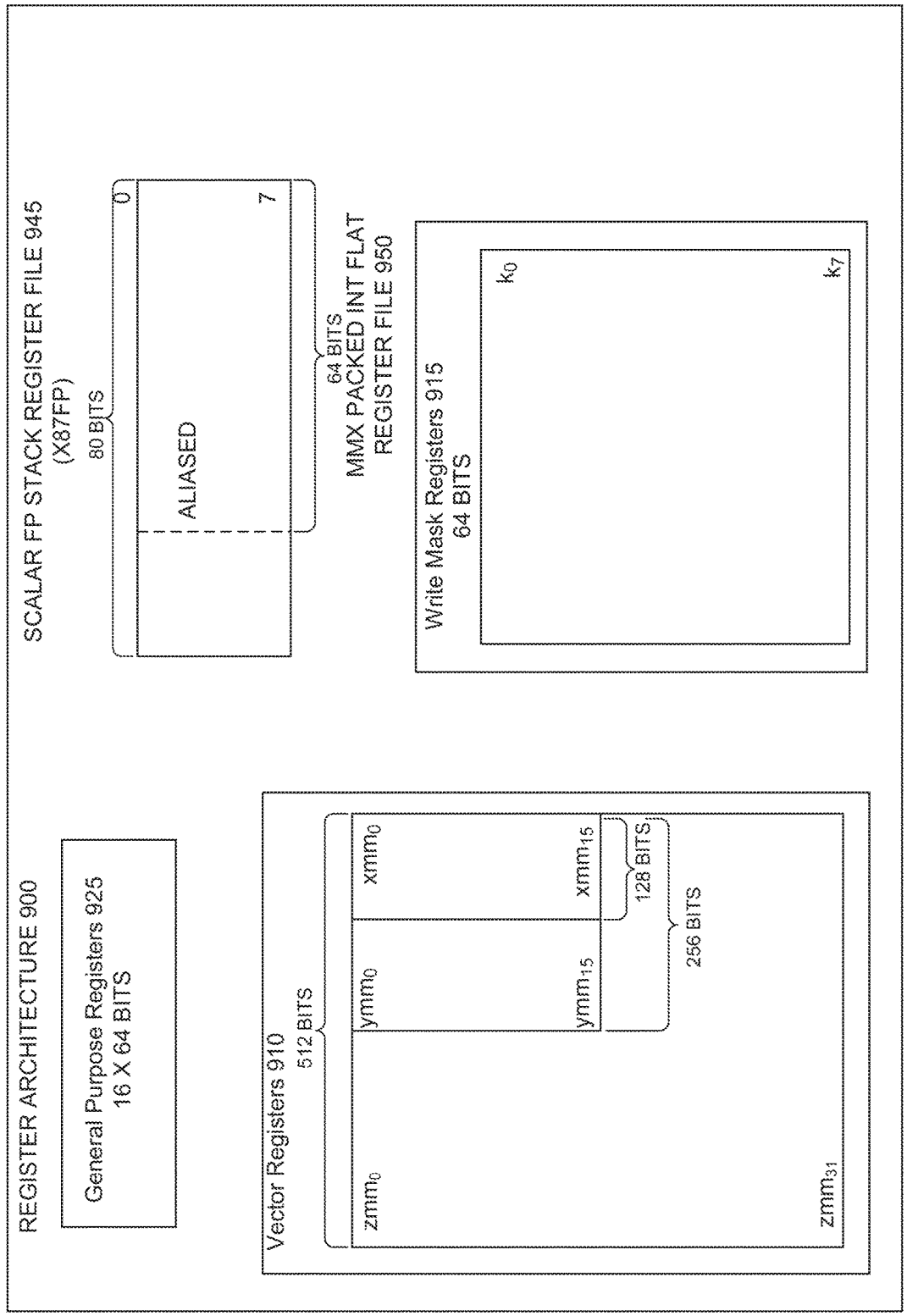
FIG. 9 is a block diagram of a register architecture according to one embodiment of the disclosure

FIG. 9 is a block diagram of a register architecture 900 according to one embodiment of the disclosure. In the embodiment illustrated, there are 32 vector registers 910 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 800 operates on these overlaid register file as illustrated in the below tables.

| | Adjustable Vector Length | Class | Operations | Registers |
|---|---|---|---|---|
| Instruction Templates that do not include the vector length field 759B | | A (FIG. 7A; U = 0) | 710, 715, 725, 730 | zmm registers (the vector length is 64 byte) |
| | | B (FIG. 7B; U = 1) | 712 | zmm registers (the vector length is 64 byte) |
| Instruction templates that do include the vector length field 759B | | B (FIG. 7B; U = 1) | 717, 727 | zmm, ymm, or xmm registers (the vector length is 64 byte, 32 byte, or 16 byte) depending on the vector length field 759B |

In other words, the vector length field 759B selects between a maximum length and one or more other shorter lengths, where each such shorter length is half the length of the preceding length; and instructions templates without the vector length field 759B operate on the maximum vector length. Further, in one embodiment, the class B instruction templates of the specific vector friendly instruction format 800 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 915—in the embodiment illustrated, there are 8 write mask registers (k0 through k7), each 64 bits in size. In an alternate embodiment, the write mask registers 915 are 16 bits in size. As previously described, in one embodiment of the disclosure, the vector mask register k0 cannot be used as a write mask; when the encoding that would normally indicate k0 is used for a write mask, it selects a hardwired write mask of 0xFFFF, effectively disabling write masking for that instruction.

General-purpose registers 925—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 945, on which is aliased the MMX packed integer flat register file 950—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the disclosure may use wider or narrower registers. Additionally, alternative embodiments of the disclosure may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 10A is a block diagram illustrating both an exemplary in-order pipeline and an exemplary register renaming, out-of-order issue/execution pipeline according to embodiments of the disclosure. FIG. 10B is a block diagram illustrating both an exemplary embodiment of an in-order architecture core and an exemplary register renaming, outof-order issue/execution architecture core to be included in a processor according to embodiments of the disclosure. The solid lined boxes in FIGS. 10A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 10A, a processor pipeline 1000 includes a fetch stage 1002, a length decode stage 1004, a decode stage 1006, an allocation stage 1008, a renaming stage 1010, a scheduling (also known as a dispatch or issue) stage 1012, a register read/memory read stage 1014, an execute stage 1016, a write back/memory write stage 1018, an exception handling stage 1022, and a commit stage 1024.

FIG. 10B shows processor core 1090 including a front end unit 1030 coupled to an execution engine unit 1050, and both are coupled to a memory unit 1070. The core 1090 may be a reduced instruction set computing (RISC) core, a complex instruction set computing (CISC) core, a very long instruction word (VLIW) core, or a hybrid or alternative core type. As yet another option, the core 1090 may be a special-purpose core, such as, for example, a network or communication core, compression engine, coprocessor core, general purpose computing graphics processing unit (GPGPU) core, graphics core, or the like.

The front end unit 1030 includes a branch prediction unit 1032 coupled to an instruction cache unit 1034, which is coupled to an instruction translation lookaside buffer (TLB) 1036, which is coupled to an instruction fetch unit 1038, which is coupled to a decode unit 1040. The decode unit 1040 (or decoder or decoder unit) may decode instructions (e.g., macro-instructions), and generate as an output one or more micro-operations, micro-code entry points, micro-instructions, other instructions, or other control signals, which are decoded from, or which otherwise reflect, or are derived from, the original instructions. The decode unit 1040 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1090 includes a microcode ROM or other medium that stores microcode for certain macroinstructions (e.g., in decode unit 1040 or otherwise within the front end unit 1030). The decode unit 1040 is coupled to a rename/allocator unit 1052 in the execution engine unit 1050.

The execution engine unit 1050 includes the rename/allocator unit 1052 coupled to a retirement unit 1054 and a set of one or more scheduler unit(s) 1056. The scheduler unit(s) 1056 represents any number of different schedulers, including reservations stations, central instruction window, etc. The scheduler unit(s) 1056 is coupled to the physical register file(s) unit(s) 1058. Each of the physical register file(s) units 1058 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1058 comprises a vector registers unit, a write mask registers unit, and a scalar registers unit. These register units may provide architectural vector registers, vector mask registers, and general purpose registers. The physical register file(s) unit(s) 1058 is overlapped by the retirement unit 1054 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1054 and the physical register file(s) unit(s) 1058 are coupled to the execution cluster(s) 1060. The execution cluster(s) 1060 includes a set of one or more execution units 1062 and a set of one or more memory access units 1064. The execution units 1062 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1056, physical register file(s) unit(s) 1058, and execution cluster(s) 1060 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1064). It should also be understood that where separate pipelines are used, one or more of these pipelines may be out-of-order issue/execution and the rest in-order.

The set of memory access units 1064 is coupled to the memory unit 1070, which includes a data TLB unit 1072 coupled to a data cache unit 1074 coupled to a level 2 (L2) cache unit 1076. In one exemplary embodiment, the memory access units 1064 may include a load unit, a store address unit, and a store data unit, each of which is coupled to the data TLB unit 1072 in the memory unit 1070. The instruction cache unit 1034 is further coupled to a level 2 (L2) cache unit 1076 in the memory unit 1070. The L2 cache unit 1076 is coupled to one or more other levels of cache and eventually to a main memory.

By way of example, the exemplary register renaming, out-of-order issue/execution core architecture may implement the pipeline 1000 as follows: 1) the instruction fetch 1038 performs the fetch and length decoding stages 1002 and 1004; 2) the decode unit 1040 performs the decode stage 1006; 3) the rename/allocator unit 1052 performs the allocation stage 1008 and renaming stage 1010; 4) the scheduler unit(s) 1056 performs the schedule stage 1012; 5) the physical register file(s) unit(s) 1058 and the memory unit 1070 perform the register read/memory read stage 1014; the execution cluster 1060 perform the execute stage 1016; 6) the memory unit 1070 and the physical register file(s) unit(s) 1058 perform the write back/memory write stage 1018; 7) various units may be involved in the exception handling stage 1022; and 8) the retirement unit 1054 and the physical register file(s) unit(s) 1058 perform the commit stage 1024.

The core 1090 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1090 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1034/1074 and a shared L2 cache unit 1076, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary in-Order Core Architecture

Figure 11B:
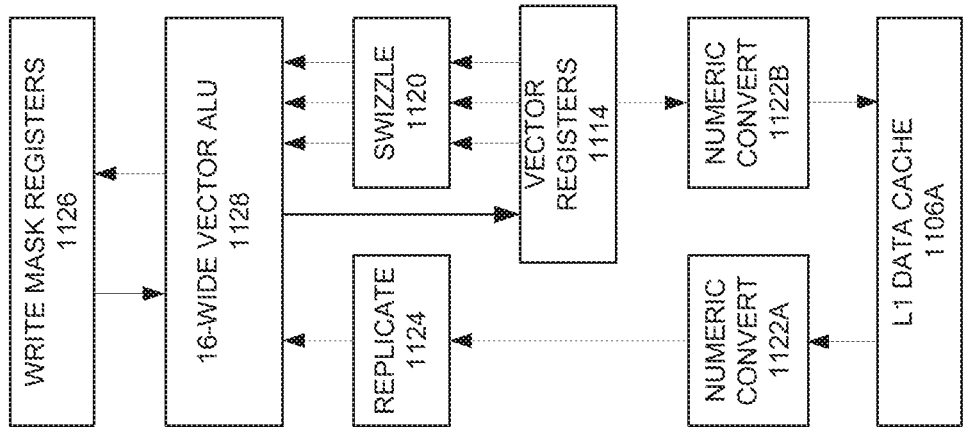
FIG. 11B is an expanded view of part of the processor core in FIG. 11A according to embodiments of the disclosure.
Figure 11A:
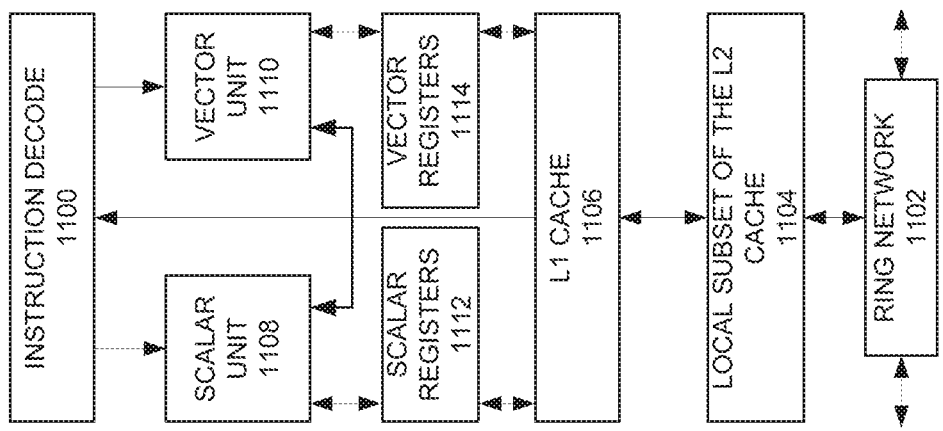
FIG. 11A is a block diagram of a single processor core, along with its connection to the on-die interconnect network and with its local subset of the Level 2 (L2) cache, according to embodiments of the disclosure.

FIGS. 11A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 11A is a block diagram of a single processor core, along with its connection to the on-die interconnect network 1102 and with its local subset of the Level 2 (L2) cache 1104, according to embodiments of the disclosure. In one embodiment, an instruction decode unit 1100 supports the x86 instruction set with a packed data instruction set extension. An L1 cache 1106 allows low-latency accesses to cache memory into the scalar and vector units. While in one embodiment (to simplify the design), a scalar unit 1108 and a vector unit 1110 use separate register sets (respectively, scalar registers 1112 and vector registers 1114) and data transferred between them is written to memory and then read back in from a level 1 (L1) cache 1106, alternative embodiments of the disclosure may use a different approach (e.g., use a single register set or include a communication path that allow data to be transferred between the two register files without being written and read back).

The local subset of the L2 cache 1104 is part of a global L2 cache that is divided into separate local subsets, one per processor core. Each processor core has a direct access path to its own local subset of the L2 cache 1104. Data read by a processor core is stored in its L2 cache subset 1104 and can be accessed quickly, in parallel with other processor cores accessing their own local L2 cache subsets. Data written by a processor core is stored in its own L2 cache subset 1104 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 11B is an expanded view of part of the processor core in FIG. 11A according to embodiments of the disclosure. FIG. 11B includes an L1 data cache 1106A part of the L1 cache 1104, as well as more detail regarding the vector unit 1110 and the vector registers 1114. Specifically, the vector unit 1110 is a 16-wide vector processing unit (VPU) (see the 16-wide ALU 1128), which executes one or more of integer, single-precision float, and double-precision float instructions. The VPU supports swizzling the register inputs with swizzle unit 1120, numeric conversion with numeric convert units 1122A-B, and replication with replication unit 1124 on the memory input. Write mask registers 1126 allow predicating resulting vector writes.

Figure 12:
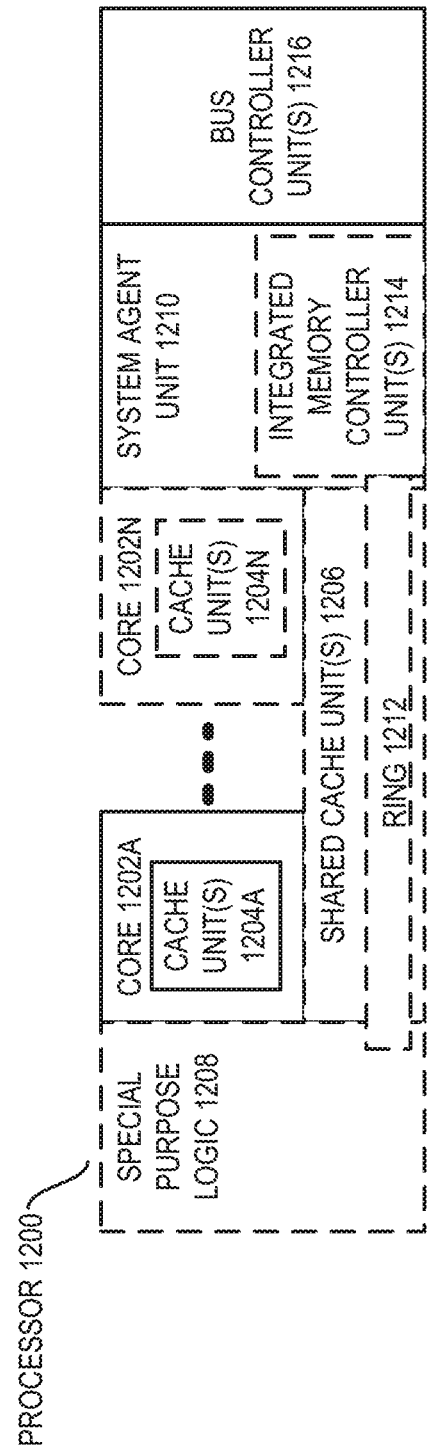
FIG. 12 is a block diagram of a processor that may have more than one core, may have an integrated memory controller, and may have integrated graphics according to embodiments of the disclosure.

FIG. 12 is a block diagram of a processor 1200 that may have more than one core, may have an integrated memory controller, and may have integrated graphics according to embodiments of the disclosure. The solid lined boxes in FIG. 12 illustrate a processor 1200 with a single core 1202A, a system agent 1210, a set of one or more bus controller units 1216, while the optional addition of the dashed lined boxes illustrates an alternative processor 1200 with multiple cores 1202A-N, a set of one or more integrated memory controller unit(s) 1214 in the system agent unit 1210, and special purpose logic 1208.

Thus, different implementations of the processor 1200 may include: 1) a CPU with the special purpose logic 1208 being integrated graphics and/or scientific (throughput) logic (which may include one or more cores), and the cores 1202A-N being one or more general purpose cores (e.g., general purpose in-order cores, general purpose out-of-order cores, a combination of the two); 2) a coprocessor with the cores 1202A-N being a large number of special purpose cores intended primarily for graphics and/or scientific (throughput); and 3) a coprocessor with the cores 1202A-N being a large number of general purpose in-order cores. Thus, the processor 1200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1206, and external memory (not shown) coupled to the set of integrated memory controller units 1214. The set of shared cache units 1206 may include one or more mid-level caches, such as level 2 (L2), level 3 (L3), level 4 (L4), or other levels of cache, a last level cache (LLC), and/or combinations thereof. While in one embodiment a ring based interconnect unit 1212 interconnects the integrated graphics logic 1208, the set of shared cache units 1206, and the system agent unit 1210/integrated memory controller unit(s) 1214, alternative embodiments may use any number of well-known techniques for interconnecting such units. In one embodiment, coherency is maintained between one or more cache units 1206 and cores 1202-A-N.

In some embodiments, one or more of the cores 1202A-N are capable of multithreading. The system agent 1210 includes those components coordinating and operating cores 1202A-N. The system agent unit 1210 may include for example a power control unit (PCU) and a display unit. The PCU may be or include logic and components needed for regulating the power state of the cores 1202A-N and the integrated graphics logic 1208. The display unit is for driving one or more externally connected displays.

The cores 1202A-N may be homogenous or heterogeneous in terms of architecture instruction set; that is, two or more of the cores 1202A-N may be capable of execution the same instruction set, while others may be capable of executing only a subset of that instruction set or a different instruction set.

Exemplary Computer Architectures

FIGS. 13-16 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 13:
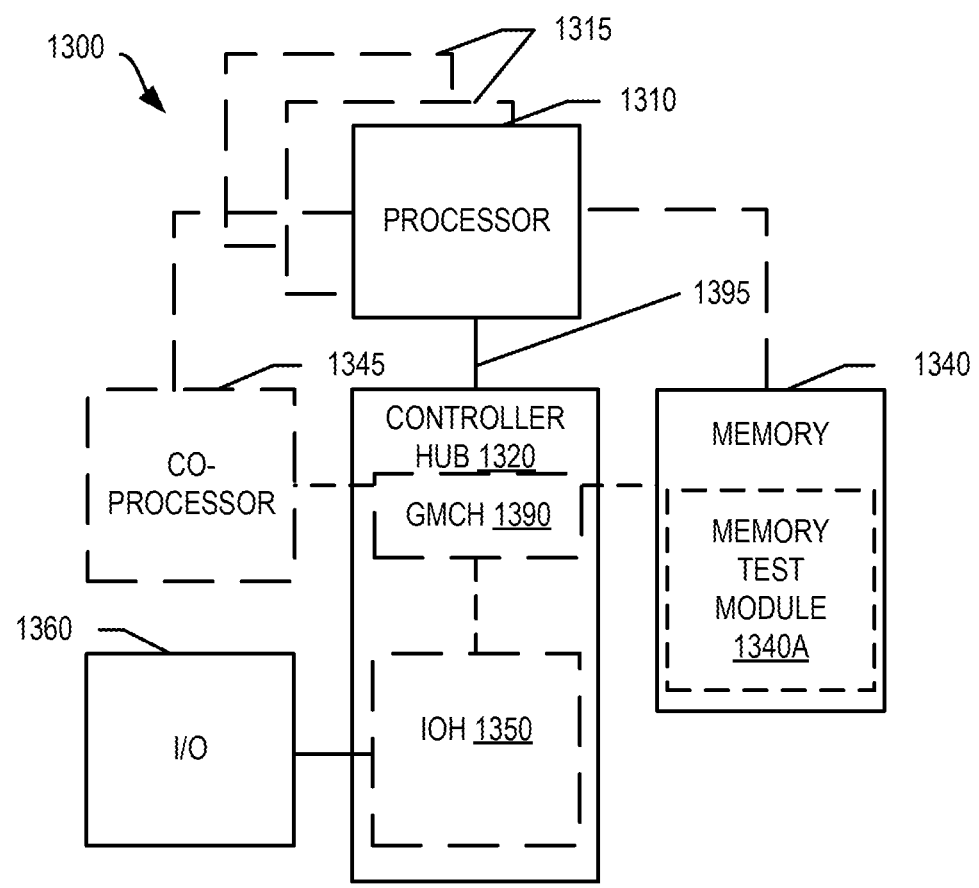
FIG. 13 is a block diagram of a system in accordance with one embodiment of the present disclosure.

Referring now to FIG. 13, shown is a block diagram of a system 1300 in accordance with one embodiment of the present disclosure. The system 1300 may include one or more processors 1310, 1315, which are coupled to a controller hub 1320. In one embodiment the controller hub 1320 includes a graphics memory controller hub (GMCH) 1390 and an Input/Output Hub (IOH) 1350 (which may be on separate chips); the GMCH 1390 includes memory and graphics controllers to which are coupled memory 1340 and a coprocessor 1345; the IOH 1350 is couples input/output (I/O) devices 1360 to the GMCH 1390. Alternatively, one or both of the memory and graphics controllers are integrated within the processor (as described herein), the memory 1340 and the coprocessor 1345 are coupled directly to the processor 1310, and the controller hub 1320 in a single chip with the IOH 1350. Memory 1340 may include a memory test module 1340A, for example, to store code that when executed causes a processor to perform any method of this disclosure.

The optional nature of additional processors 1315 is denoted in FIG. 13 with broken lines. Each processor 1310, 1315 may include one or more of the processing cores described herein and may be some version of the processor 1200.

The memory 1340 may be, for example, dynamic random access memory (DRAM), phase change memory (PCM), or a combination of the two. For at least one embodiment, the controller hub 1320 communicates with the processor(s) 1310, 1315 via a multi-drop bus, such as a frontside bus (FSB), point-to-point interface such as QuickPath Interconnect (QPI), or similar connection 1395.

In one embodiment, the coprocessor 1345 is a special-purpose processor, such as, for example, a high-throughput MIC processor, a network or communication processor, compression engine, graphics processor, GPGPU, embedded processor, or the like. In one embodiment, controller hub 1320 may include an integrated graphics accelerator.

There can be a variety of differences between the physical resources 1310, 1315 in terms of a spectrum of metrics of merit including architectural, microarchitectural, thermal, power consumption characteristics, and the like.

In one embodiment, the processor 1310 executes instructions that control data processing operations of a general type. Embedded within the instructions may be coprocessor instructions. The processor 1310 recognizes these coprocessor instructions as being of a type that should be executed by the attached coprocessor 1345. Accordingly, the processor 1310 issues these coprocessor instructions (or control signals representing coprocessor instructions) on a coprocessor bus or other interconnect, to coprocessor 1345. Coprocessor(s) 1345 accept and execute the received coprocessor instructions.

Figure 14:
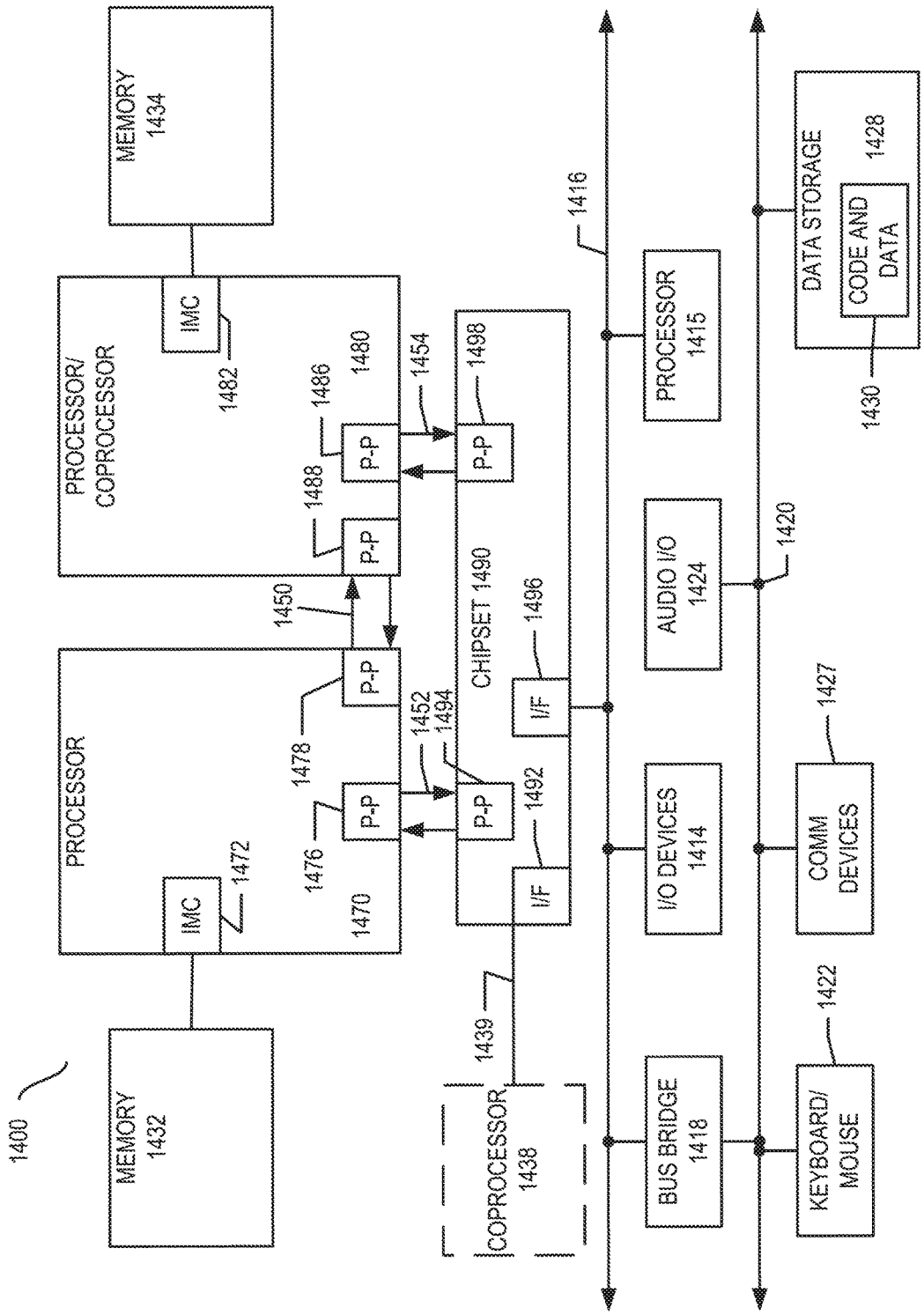
FIG. 14 is a block diagram of a more specific exemplary system in accordance with an embodiment of the present disclosure.

Referring now to FIG. 14, shown is a block diagram of a first more specific exemplary system 1400 in accordance with an embodiment of the present disclosure. As shown in FIG. 14, multiprocessor system 1400 is a point-to-point interconnect system, and includes a first processor 1470 and a second processor 1480 coupled via a point-to-point interconnect 1450. Each of processors 1470 and 1480 may be some version of the processor 1200. In one embodiment of the disclosure, processors 1470 and 1480 are respectively processors 1310 and 1315, while coprocessor 1438 is coprocessor 1345. In another embodiment, processors 1470 and 1480 are respectively processor 1310 coprocessor 1345.

Processors 1470 and 1480 are shown including integrated memory controller (IMC) units 1472 and 1482, respectively. Processor 1470 also includes as part of its bus controller units point-to-point (P-P) interfaces 1476 and 1478; similarly, second processor 1480 includes P-P interfaces 1486 and 1488. Processors 1470, 1480 may exchange information via a point-to-point (P-P) interface 1450 using P-P interface circuits 1478, 1488. As shown in FIG. 14, IMCs 1472 and 1482 couple the processors to respective memories, namely a memory 1432 and a memory 1434, which may be portions of main memory locally attached to the respective processors.

Processors 1470, 1480 may each exchange information with a chipset 1490 via individual P-P interfaces 1452, 1454 using point to point interface circuits 1476, 1494, 1486, 1498. Chipset 1490 may optionally exchange information with the coprocessor 1438 via a high-performance interface 1439. In one embodiment, the coprocessor 1438 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1490 may be coupled to a first bus 1416 via an interface 1496. In one embodiment, first bus 1416 may be a Peripheral Component Interconnect (PCI) bus, or a bus such as a PCI Express bus or another third generation I/O interconnect bus, although the scope of the present disclosure is not so limited.

As shown in FIG. 14, various I/O devices 1414 may be coupled to first bus 1416, along with a bus bridge 1418 which couples first bus 1416 to a second bus 1420. In one embodiment, one or more additional processor(s) 1415, such as coprocessors, high-throughput MIC processors, GPGPU's, accelerators (such as, e.g., graphics accelerators or digital signal processing (DSP) units), field programmable gate arrays, or any other processor, are coupled to first bus 1416. In one embodiment, second bus 1420 may be a low pin count (LPC) bus. Various devices may be coupled to a second bus 1420 including, for example, a keyboard and/or mouse 1422, communication devices 1427 and a storage unit 1428 such as a disk drive or other mass storage device which may include instructions/code and data 1430, in one embodiment. Further, an audio I/O 1424 may be coupled to the second bus 1420. Note that other architectures are possible. For example, instead of the point-to-point architecture of FIG. 14, a system may implement a multi-drop bus or other such architecture.

Figure 15:
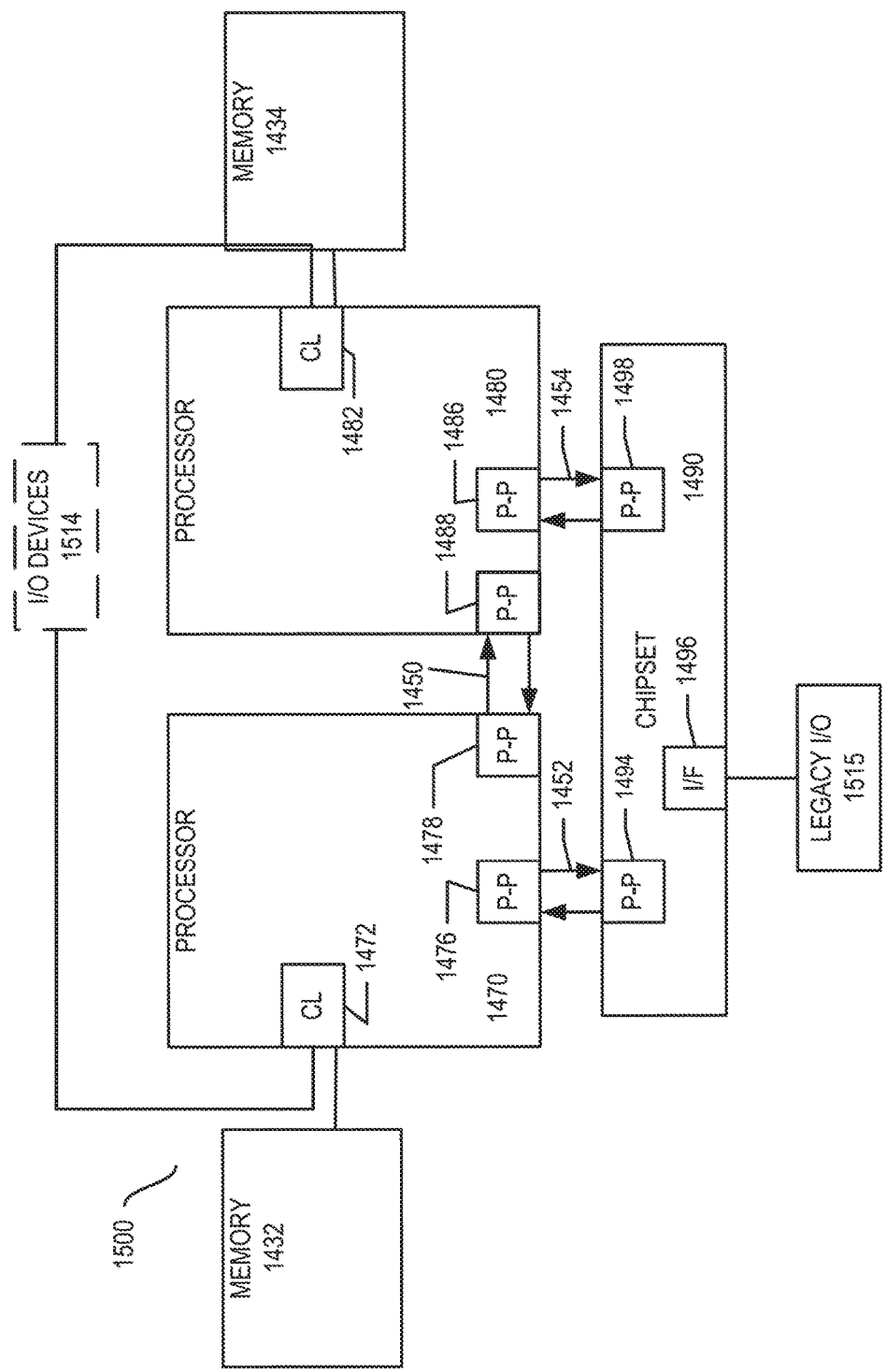
FIG. 15, shown is a block diagram of a second more specific exemplary system in accordance with an embodiment of the present disclosure.

Referring now to FIG. 15, shown is a block diagram of a second more specific exemplary system 1500 in accordance with an embodiment of the present disclosure Like elements in FIGS. 14 and 15 bear like reference numerals, and certain aspects of FIG. 14 have been omitted from FIG. 15 in order to avoid obscuring other aspects of FIG. 15.

FIG. 15 illustrates that the processors 1470, 1480 may include integrated memory and I/O control logic ("CL") 1472 and 1482, respectively. Thus, the CL 1472, 1482 include integrated memory controller units and include I/O control logic. FIG. 15 illustrates that not only are the memories 1432, 1434 coupled to the CL 1472, 1482, but also that I/O devices 1514 are also coupled to the control logic 1472, 1482. Legacy I/O devices 1515 are coupled to the chipset 1490.

Figure 16:
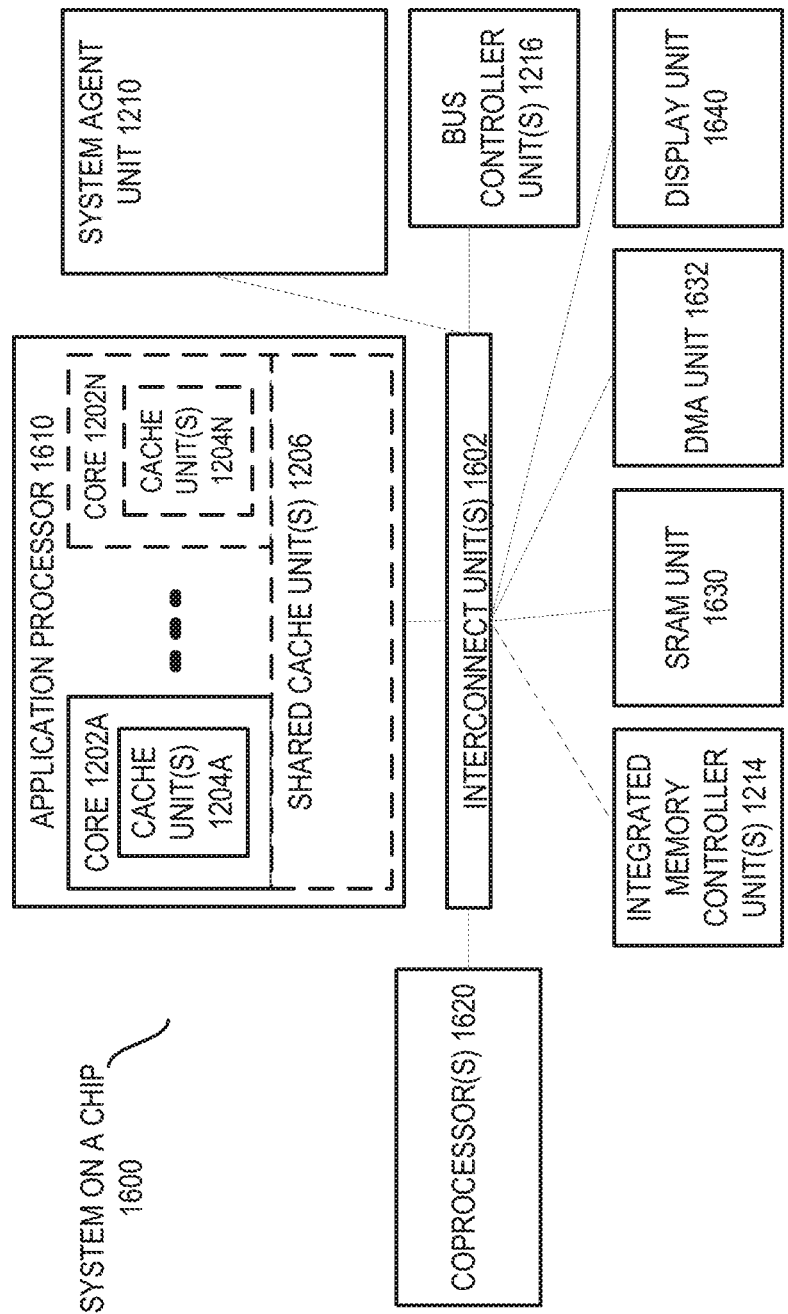
FIG. 16, shown is a block diagram of a system on a chip (SoC) in accordance with an embodiment of the present disclosure.

Referring now to FIG. 16, shown is a block diagram of a SoC 1600 in accordance with an embodiment of the present disclosure. Similar elements in FIG. 12 bear like reference numerals. Also, dashed lined boxes are optional features on more advanced SoCs. In FIG. 16, an interconnect unit(s) 1602 is coupled to: an application processor 1610 which includes a set of one or more cores 202A-N and shared cache unit(s) 1206; a system agent unit 1210; a bus controller unit(s) 1216; an integrated memory controller unit(s) 1214; a set or one or more coprocessors 1620 which may include integrated graphics logic, an image processor, an audio processor, and a video processor; an static random access memory (SRAM) unit 1630; a direct memory access (DMA) unit 1632; and a display unit 1640 for coupling to one or more external displays. In one embodiment, the coprocessor(s) 1620 include a special-purpose processor, such as, for example, a network or communication processor, compression engine, GPGPU, a high-throughput MIC processor, embedded processor, or the like.

Embodiments (e.g., of the mechanisms) disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 1430 illustrated in FIG. 14, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the disclosure also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 17:
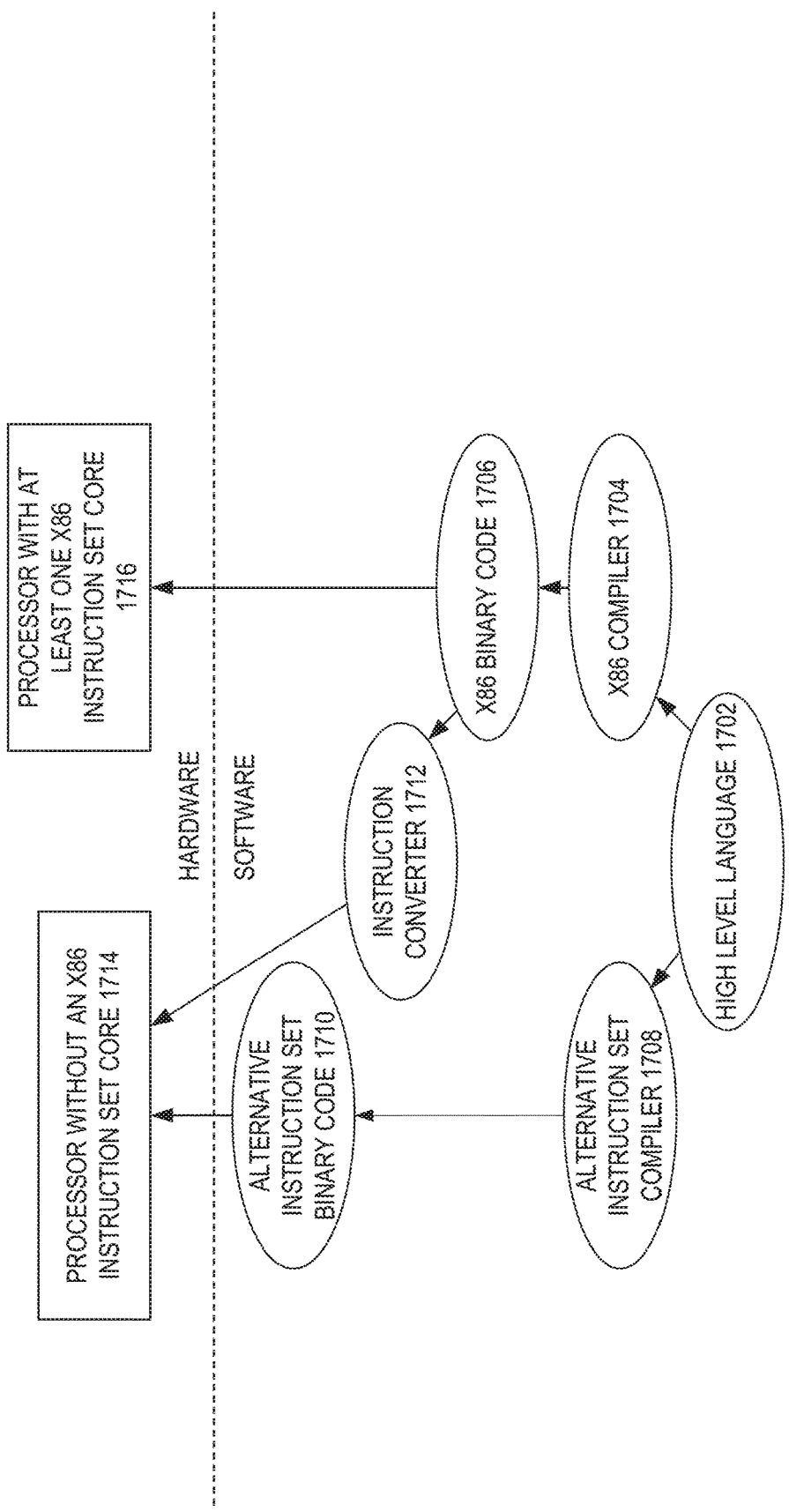
FIG. 17 is a block diagram contrasting the use of a software instruction converter to convert binary instructions in a source instruction set to binary instructions in a target instruction set according to embodiments of the disclosure.

FIG. 17 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 17 shows a program in a high level language 1702 may be compiled using an x86 compiler 1704 to generate x86 binary code 1706 that may be natively executed by a processor with at least one x86 instruction set core 1716. The processor with at least one x86 instruction set core 1716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1704 represents a compiler that is operable to generate x86 binary code 1706 (e.g., object code) that can, with or without additional linkage processing, be executed on the processor with at least one x86 instruction set core 1716. Similarly, FIG. 17 shows the program in the high level language 1702 may be compiled using an alternative instruction set compiler 1708 to generate alternative instruction set binary code 1710 that may be natively executed by a processor without at least one x86 instruction set core 1714 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1712 is used to convert the x86 binary code 1706 into code that may be natively executed by the processor without an x86 instruction set core 1714. This converted code is not likely to be the same as the alternative instruction set binary code 1710 because an instruction converter capable of this is difficult to make; however, the converted code will accomplish the general operation and be made up of instructions from the alternative instruction set. Thus, the instruction converter 1712 represents software, firmware, hardware, or a combination thereof that, through emulation, simulation or any other process, allows a processor or other electronic device that does not have an x86 instruction set processor or core to execute the x86 binary code 1706.

What is claimed is:

1. A processor comprising:
a decoder to decode an instruction, having a first operand to identify a section of a data storage device, into a decoded instruction; and
an execution unit to execute the decoded instruction to:
perform a check of the section of the data storage device for a memory fault that is to cause a machine check exception that shuts down the processor when data is accessed by the processor at the section, and
provide as a resultant of the instruction an indication of failure when there is the memory fault without causing the machine check exception, and an indication of success when there is not the memory fault.

2. The processor of claim 1, wherein the instruction comprises a second operand to indicate a length of the section of the data storage device, and the first operand is to indicate a starting virtual address of the section of the data storage device.

3. The processor of claim 1, wherein the indication of failure is an offset, from a starting virtual address of the section of the data storage device, where the memory fault occurred.

4. The processor of claim 1, wherein the indication of failure is an address where the memory fault occurred.

5. The processor of claim 4, wherein the address is a virtual address.

6. The processor of claim 1, wherein the execution unit is to execute the decoded instruction to further: check that the section of the data storage device has a starting address that is cache line aligned.

7. The processor of claim 1, wherein the execution unit is to execute the decoded instruction to further: check that a length of the section is a multiple of a cache line size of the data storage device.

8. The processor of claim 1, wherein the execution unit is to execute the decoded instruction to write the resultant to a register.

9. A method comprising:
decoding an instruction, having a first operand to identify a section of a data storage device, into a decoded instruction with a decoder of a processor; and
executing the decoded instruction with an execution unit of the processor to:
perform a check of the section of the data storage device for a memory fault that is to cause a machine check exception that shuts down the processor when data is accessed by the processor at the section, and
provide as a resultant of the instruction an indication of failure when there is the memory fault without causing the machine check exception, and an indication of success when there is not the memory fault.

10. The method of claim 9, wherein the instruction comprises a second operand indicating a length of the section of the data storage device, and the first operand indicates a starting virtual address of the section of the data storage device.

11. The method of claim 9, wherein the indication of failure is an offset, from a starting virtual address of the section of the data storage device, where the memory fault occurred.

12. The method of claim 9, wherein the indication of failure is an address where the memory fault occurred.

13. The method of claim 12, wherein the address is a virtual address.

14. The method of claim 9, wherein the executing the decoded instruction with the execution unit of the processor is to further: check that the section of the data storage device has a starting address that is cache line aligned.

15. The method of claim 9, wherein the executing the decoded instruction with the execution unit of the processor is to further: check that a length of the section is a multiple of a cache line size of the data storage device.

16. The method of claim 9, wherein the executing the decoded instruction with the execution unit of the processor is to write the resultant to a register.

17. A non-transitory machine readable storage medium having code that, when executed, causes a machine to perform a method comprising:
decoding an instruction, having a first operand to identify a section of a data storage device, into a decoded instruction with a decoder of a processor; and
executing the decoded instruction with an execution unit of the processor to:
perform a check of the section of the data storage device for a memory fault that is to cause a machine check exception that shuts down the processor when data is accessed by the processor at the section, and
provide as a resultant of the instruction an indication of failure when there is the memory fault without causing the machine check exception, and an indication of success when there is not the memory fault.

18. The non-transitory machine readable storage medium of claim 17, wherein the instruction comprises a second operand indicating a length of the section of the data storage device, and the first operand indicates a starting virtual address of the section of the data storage device.

19. The non-transitory machine readable storage medium of claim 17, wherein the indication of failure is an offset, from a starting virtual address of the section of the data storage device, where the memory fault occurred.

20. The non-transitory machine readable storage medium of claim 17, wherein the indication of failure is an address where the memory fault occurred.

21. The non-transitory machine readable storage medium of claim 20, wherein the address is a virtual address.

22. The non-transitory machine readable storage medium of claim 17, wherein the executing the decoded instruction with the execution unit of the processor is to further: check that the section of the data storage device has a starting address that is cache line aligned.

23. The non-transitory machine readable storage medium of claim 17, wherein the executing the decoded instruction with the execution unit of the processor is to further: check that a length of the section is a multiple of a cache line size of the data storage device.

24. The non-transitory machine readable storage medium of claim 17, wherein the executing the decoded instruction with the execution unit of the processor is to write the resultant to a register.

* * * * *